(12) United States Patent
Suzuki et al.

(10) Patent No.: US 11,194,025 B2
(45) Date of Patent: Dec. 7, 2021

(54) SOLID-STATE IMAGING DEVICE AND IMAGING APPARATUS INCLUDING SAME

(71) Applicant: PANASONIC INTELLECTUAL PROPERTY MANAGEMENT CO., LTD., Osaka (JP)

(72) Inventors: Sei Suzuki, Osaka (JP); Junichi Matsuo, Osaka (JP); Shinichi Kawai, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 16/817,145

(22) Filed: Mar. 12, 2020

(65) Prior Publication Data
US 2020/0213539 A1    Jul. 2, 2020

Related U.S. Application Data

(63) Continuation of application No. PCT/JP2018/029872, filed on Aug. 9, 2018.

(30) Foreign Application Priority Data

Sep. 14, 2017   (JP) .............................. JP2017-176995

(51) Int. Cl.
H04N 9/47        (2006.01)
H04N 7/18        (2006.01)
(Continued)

(52) U.S. Cl.
CPC .......... *G01S 7/4863* (2013.01); *G01S 17/894* (2020.01); *H04N 5/33* (2013.01); *H04N 5/353* (2013.01); *H04N 5/378* (2013.01)

(58) Field of Classification Search
CPC ..... G01S 7/4863; G01S 17/894; H04N 5/353; H04N 5/378; H04N 5/33; H04N 5/332;
(Continued)

(56) References Cited

U.S. PATENT DOCUMENTS

2008/0122933 A1   5/2008  Murayama
2015/0341573 A1*  11/2015 Matsuo .................. H04N 9/045
                                                            348/135
(Continued)

FOREIGN PATENT DOCUMENTS

EP      3 141 930 A1     3/2017
JP      2015-215181 A    12/2015
(Continued)

OTHER PUBLICATIONS

Partial Supplementary European Search Report dated Oct. 15, 2020, issued in the corresponding European Patent Application No. 18857258.0.

(Continued)

*Primary Examiner* — Masum Billah
(74) *Attorney, Agent, or Firm* — McDermott Will and Emery LLP

(57) ABSTRACT

A solid-state imaging device includes: pixels arranged in a matrix on a semiconductor substrate. Each of the pixels includes: a photoelectric converter that converts received light into a signal charge; at least one read gate that reads the signal charge from the photoelectric converter; charge accumulators that each accumulate the signal charge read by the at least one read gate; and a charge holder that receives, from one of the charge accumulators, transfer of the signal charge accumulated in the charge accumulator, holds the signal charge, and transfers, to one of the charge accumulators, the signal charge held, each of the charge accumulators includes a part of a transfer channel and a part of a transfer electrode overlapping with the part of the transfer channel in a planar view of the semiconductor substrate, and the transfer channel per one pixel comprises transfer channels.

17 Claims, 38 Drawing Sheets

(51) Int. Cl.
*G01S 7/4863* (2020.01)
*G01S 17/894* (2020.01)
*H04N 5/33* (2006.01)
*H04N 5/353* (2011.01)
*H04N 5/378* (2011.01)

(58) Field of Classification Search
CPC ......... H04N 2209/045; H04N 5/37213; H04N 5/376
USPC .......................................... 348/135
See application file for complete search history.

(56) References Cited

U.S. PATENT DOCUMENTS

| | | |
|---|---|---|
| 2016/0344967 A1 | 11/2016 | Barnes et al. |
| 2017/0045618 A1 | 2/2017 | Mase et al. |
| 2017/0187968 A1* | 6/2017 | Kobayashi ........... H04N 5/3745 |
| 2018/0156898 A1 | 6/2018 | Suzuki et al. |
| 2019/0280025 A1* | 9/2019 | Sakakibara ....... H01L 27/14603 |

FOREIGN PATENT DOCUMENTS

| | | | |
|---|---|---|---|
| WO | 2017/022220 A1 | 2/2017 | |
| WO | WO-2017022220 A1 * | 2/2017 | ........... G01S 7/4863 |

OTHER PUBLICATIONS

Extended European Search Report dated on Feb. 2, 2021 issued in the corresponding European patent application No. 18857258.0.
International Search Report and Written Opinion dated Oct. 30, 2018 in International Application No. PCT/JP2018/029872; with partial English translation.

* cited by examiner

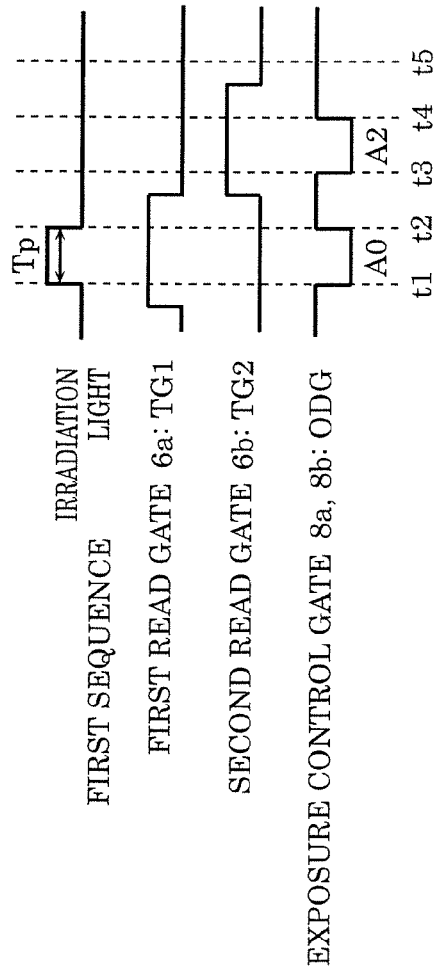
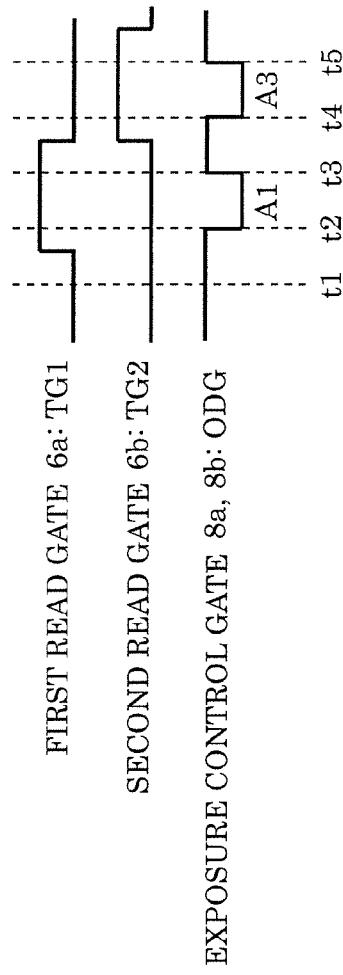

FIG. 13D

|  | A0 | A2 | A1 | A3 |
|---|---|---|---|---|
| DISTANCE MEASURING RANGE 1 | PRECEDING COMPONENT | BG | SUCCEEDING COMPONENT | BG |
| DISTANCE MEASURING RANGE 2 | BG | PRECEDING COMPONENT | SUCCEEDING COMPONENT | BG |
| DISTANCE MEASURING RANGE 3 | BG | PRECEDING COMPONENT | BG | SUCCEEDING COMPONENT |

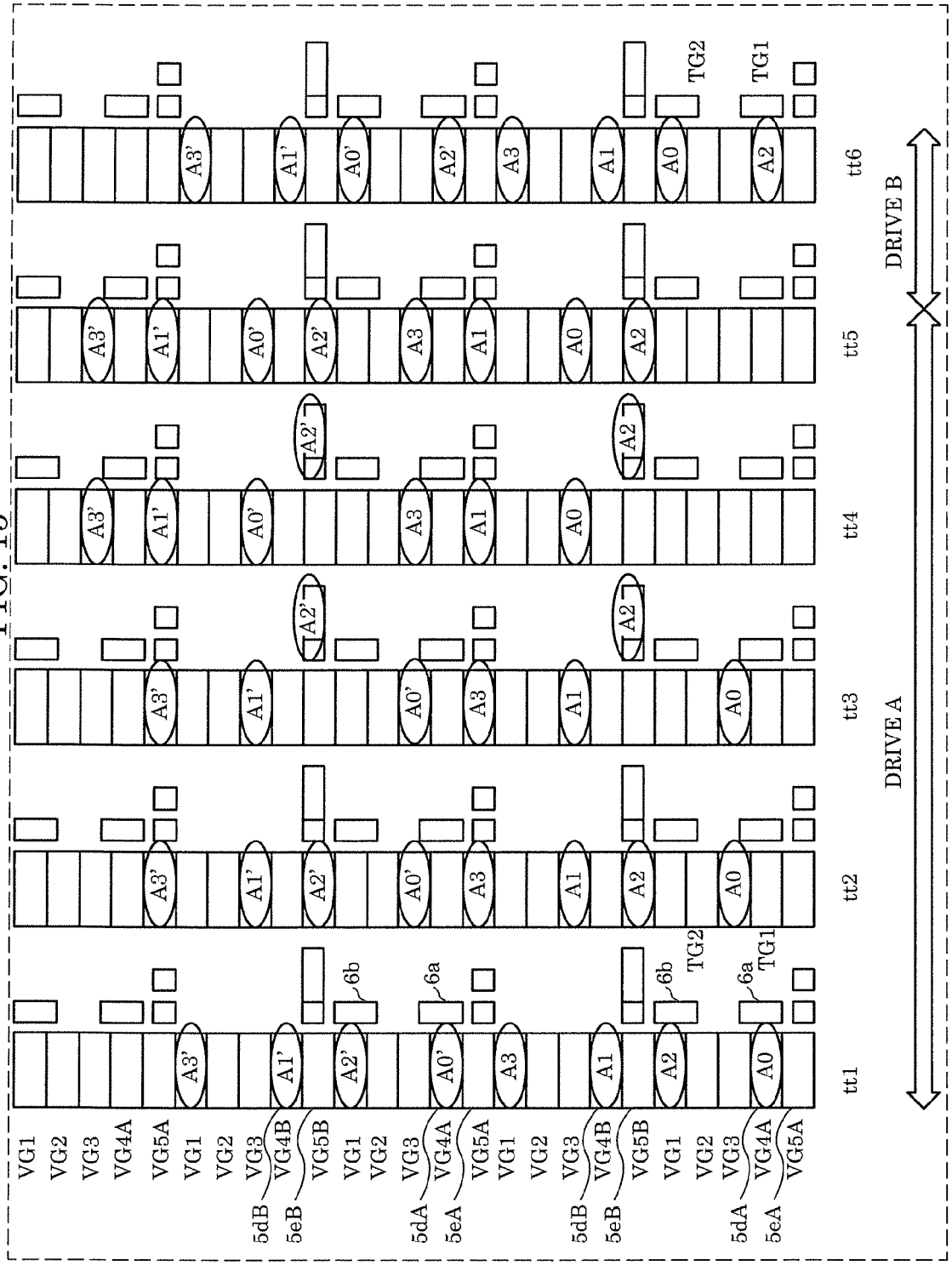

SOLID-STATE IMAGING DEVICE AND IMAGING APPARATUS INCLUDING SAME

CROSS REFERENCE TO RELATED APPLICATIONS

This application is a U.S. continuation application of PCT International Patent Application Number PCT/JP2018/029872 filed on Aug. 9, 2018, claiming the benefit of priority of Japanese Patent Application Number 2017-176995 filed on Sep. 14, 2017, the entire contents of which are hereby incorporated by reference.

BACKGROUND

1. Technical Field

The present disclosure relates to a solid-state imaging device that obtains a distance image of a subject.

2. Description of the Related Art

Solid-state imaging devices that obtain distance images of subjects using a time of flight (TOF) method are conventionally known (for example, see Japanese Unexamined Patent Application Publication No. 2015-215181).

SUMMARY

With conventional solid-state imaging devices, motion blur may occur when obtaining a distance image of a moving subject.

The present disclosure therefore has an object of providing a solid-state imaging device that can suppress motion blur when obtaining a distance image of a subject as compared with conventional techniques, and an imaging apparatus including the same.

A solid-state imaging device according to one aspect of the present disclosure is a solid-state imaging device including: a plurality of pixels arranged in a matrix on a semiconductor substrate, wherein each of the plurality of pixels includes: a photoelectric converter that converts received light into a signal charge; at least one read gate that reads the signal charge from the photoelectric converter; a plurality of charge accumulators that each accumulate the signal charge read by the at least one read gate; and a charge holder that receives, from one of the plurality of charge accumulators, transfer of the signal charge accumulated in the charge accumulator, holds the signal charge, and transfers, to one of the plurality of charge accumulators, the signal charge held, each of the plurality of charge accumulators includes a part of a transfer channel for transferring the signal charge and a part of a transfer electrode overlapping with the part of the transfer channel in a planar view of the semiconductor substrate, and the transfer channel per one pixel comprises a plurality of transfer channels.

An imaging apparatus according to another aspect of the present disclosure includes: the solid-state imaging device described above; a light source that emits infrared light in a pulse form at a plurality of timings, in each exposure period in one frame period; and a processor that generates a distance image based on an output signal of the solid-state imaging device.

The above-described solid-state imaging device and imaging apparatus can suppress motion blur when obtaining a distance image of a subject as compared with conventional techniques.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 11A is a drive timing chart illustrating operation of the solid-state imaging device according to Embodiment 1 during exposure;

FIG. 11B is a drive timing chart illustrating operation of the solid-state imaging device according to Embodiment 1 during exposure;

FIG. 13D is a correspondence table indicating the correspondence relationship between each distance measuring range and signals A0, A1, A2, and A3 accumulated in charge accumulators in Embodiment 1;

FIG. 15 is a schematic plan diagram illustrating signal interchange operation of the solid-state imaging device according to Embodiment 1;

DETAILED DESCRIPTION OF THE EMBODIMENTS (Circumstances Leading to Attainment of One Aspect of the Present Disclosure)

Of a plurality of methods for detecting the distance to an object, a TOF method that measures a distance using a time of flight during which light travels to and from a measurement object is known.

Figure 27:
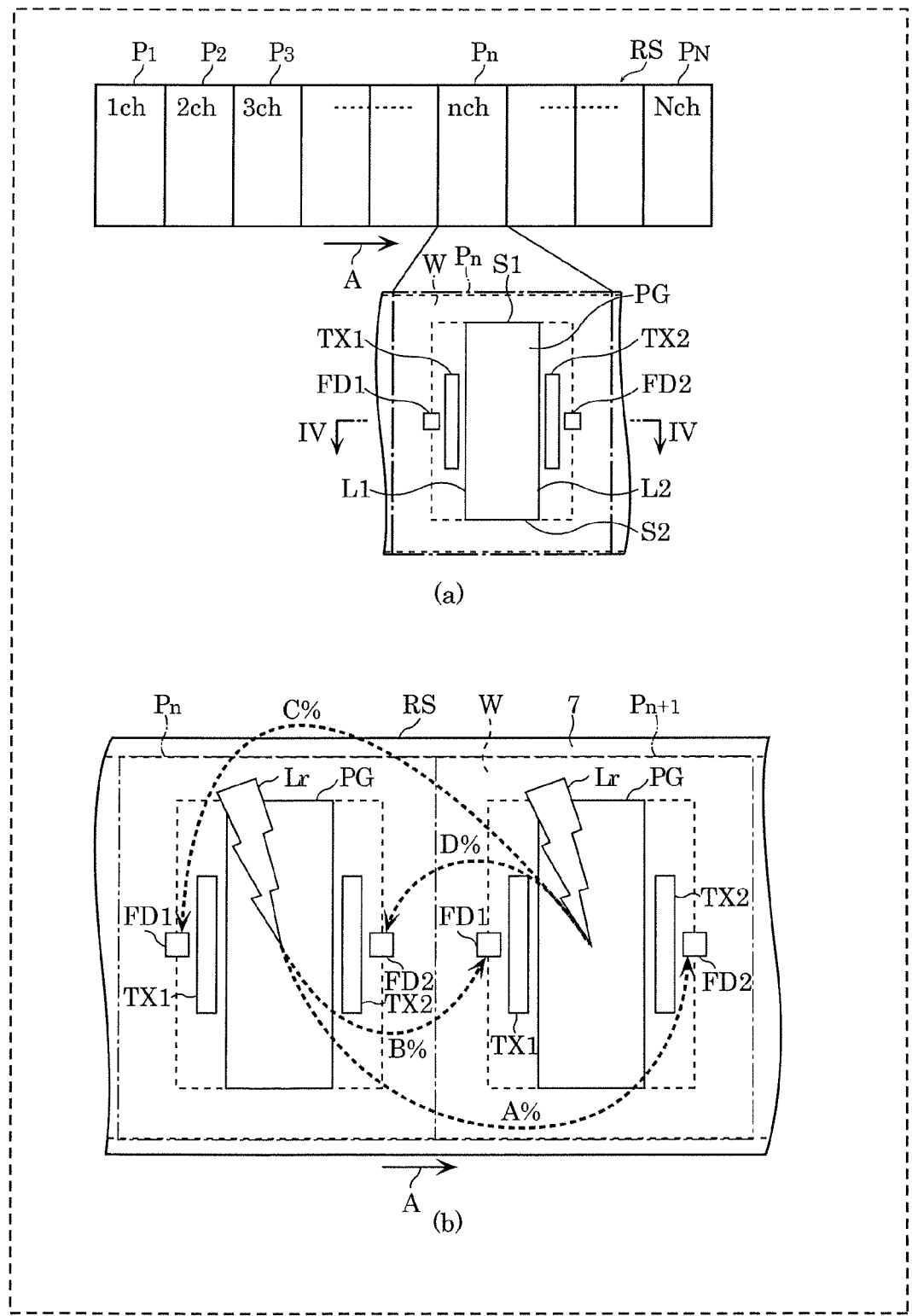
FIG. 27 is a plan diagram of a pixel in a conventional distance measuring apparatus.
Figure 28:
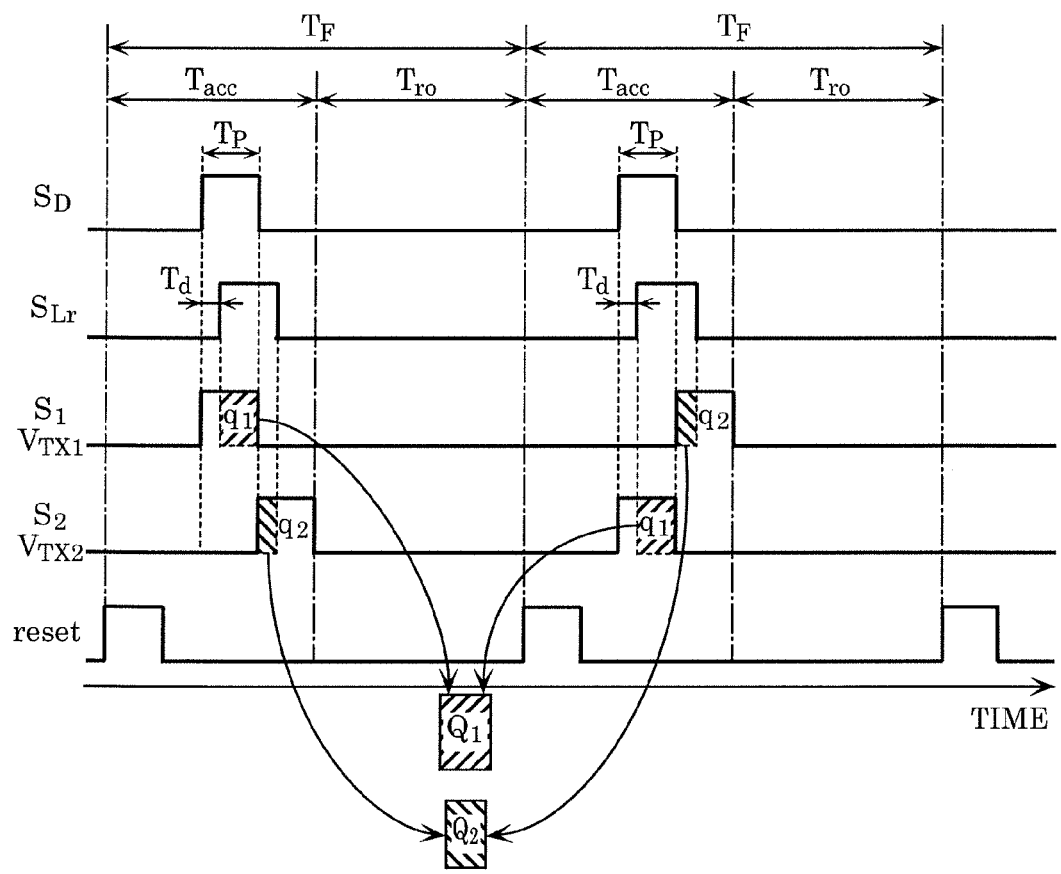
FIG. 28 is a timing chart of each signal in the conventional distance measuring apparatus.

FIGS. 27 and 28 illustrate a conventional distance measuring apparatus disclosed in Japanese Unexamined Patent Application Publication No. 2015-215181.

FIG. 27 is a pixel plan diagram of the conventional technique. FD1 and FD2 are first and second charge accumulation regions, TX1 and TX2 are first and second transfer electrodes, and PG is a photo-gate electrode.

FIG. 28 is a timing chart of each signal in the conventional distance measuring apparatus. Of a plurality of frame cycles $T_F$, two frame cycles $T_F$ successive in chronological order are illustrated. $S_D$ is a light source drive signal, $S_{Lr}$ is a reflected light intensity signal when pulse light reflected at an object returns to an imaging region, S1 is first pulse signal S1 applied to first transfer electrode TX1, S2 is second pulse signal S2 applied to second transfer electrode TX2, reset is a reset signal, $T_{acc}$ is an accumulation period, and $T_{ro}$ is a read period.

The conventional technique described in Japanese Unexamined Patent Application Publication No. 2015-215181 suppresses differences in leakage (crosstalk) of charges from neighboring pixels as illustrated in (b) in FIG. 27, by interchanging timings of pulses applied to read gates between frames and using, for distance calculation, two signals Q1 and Q2 obtained by adding signals for two frames as illustrated in FIG. 28.

With the conventional technique, however, there is a time difference in exposure period between frames, because the read timings are changed between the frames. Hence, motion blur tends to occur. Two frames need to be read in order to obtain added distance signals. This causes a decrease in effective frame rate, and requires frame memory outside.

Moreover, the conventional technique fails to take into account background light components and dark current components, and accordingly has significant distance measuring errors in environments in which such signals not including distance information are not negligible.

In view of the above, the inventors conducted repeatedly study, and conceived a solid-state imaging device that achieves high distance measuring accuracy without motion blur and a considerable decrease in frame rate.

Embodiments of the present disclosure will be described below, with reference to the drawings. Although the attached drawings are referred to in the description, they are provided for illustrative purposes, and do not limit the present disclosure. Elements indicating substantially same structures, operations, and effects in the drawings are given the same reference marks.

Modes forming basis of the present disclosure will be described first.

(Basic Mode 1 of the Present Disclosure)

Figure 1:
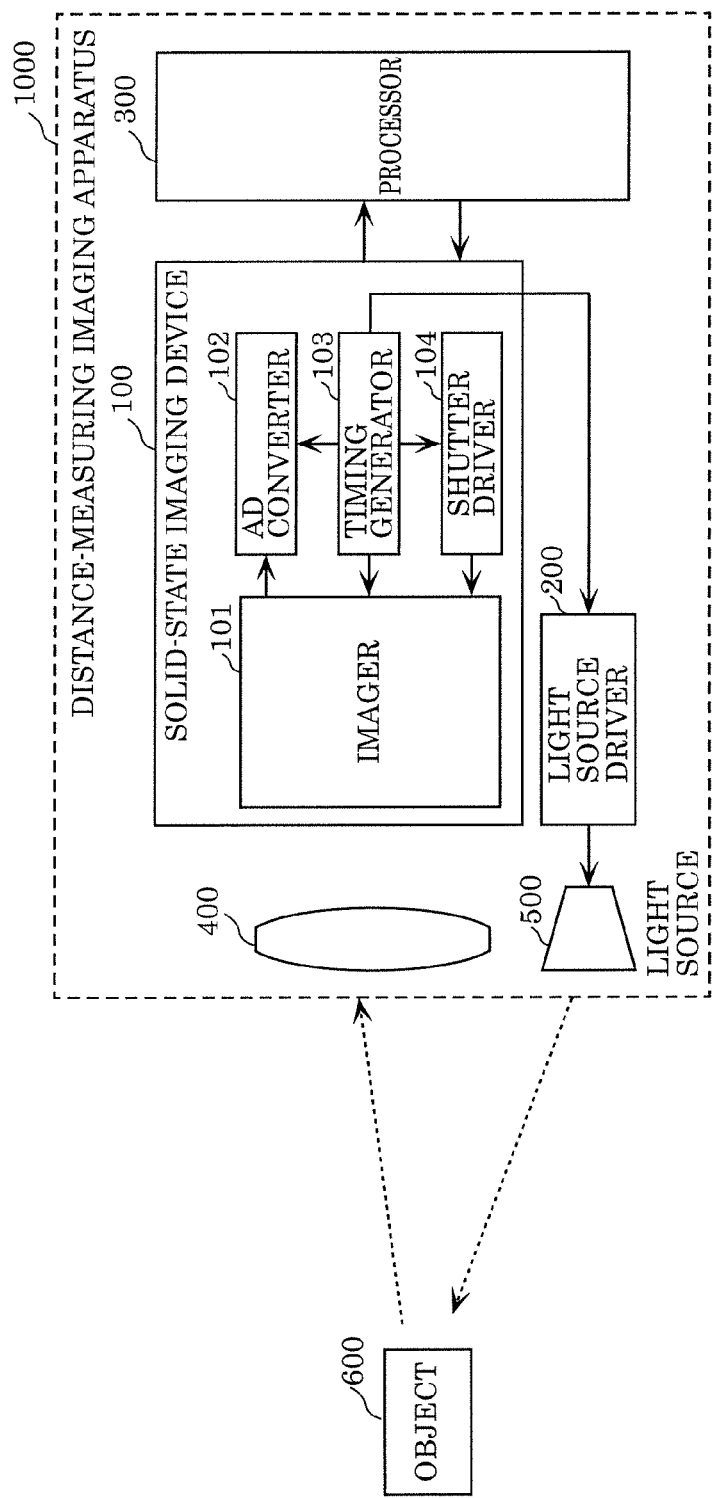
FIG. 1 is a functional block diagram illustrating an example of a schematic structure of a distance-measuring imaging apparatus (imaging apparatus) according to Basic Mode 1.

FIG. 1 is a functional block diagram illustrating an example of a schematic structure of distance-measuring imaging apparatus 1000 according to Mode 1 (Basic Mode 1) forming basis of the present disclosure. As illustrated in the drawing, distance-measuring imaging apparatus 1000 includes solid-state imaging device 100, light source driver 200, processor 300, optical lens 400, and light source 500. Solid-state imaging device 100 includes imager 101, AD converter 102, timing generator 103, and shutter driver 104.

Timing generator 103 generates a light emission signal instructing light source 500 to irradiate object 600 with light (e.g. near-infrared light) and drives light source 500 via light source driver 200, and generates an exposure signal instructing imager 101 to perform exposure to reflected light from object 600.

Imager 101 includes a plurality of pixels arranged in a matrix on a semiconductor substrate. Imager 101 performs, for a region including object 600, exposure a plurality of times in one frame period according to timing indicated by the exposure signal generated by timing generator 103, and obtains a signal corresponding to the total sum of the exposure amounts of the exposure performed the plurality of times.

Processor 300 calculates the distance to object 600, based on a signal received from solid-state imaging device 100.

As illustrated in FIG. 1, object 600 is irradiated with near-infrared light from light source 500 in the presence of background light. Reflected light from object 600 is incident on imager 101 through optical lens 400. The reflected light incident on imager 101 forms an image, and the formed image is converted into an electrical signal. Operations of light source 500 and solid-state imaging device 100 are controlled by timing generator 103 in solid-state imaging device 100. An output of solid-state imaging device 100 is converted into a distance image by processor 300, and converted into a visible image depending on the purpose. Processor 300 does not necessarily need to be provided outside solid-state imaging device 100, and solid-state imaging device 100 may include all or part of functions of distance calculation and the like.

Solid-state imaging device 100 is, for example, a CMOS image sensor.

In a typical pulse TOF method, a first exposure period starting from a rise time of irradiation light with pulse width Tp is denoted by T1, a second exposure period starting from a fall time of the irradiation light is denoted by T2, and exposure periods T1 and T2 are set to the same length as pulse width Tp. When the signal amount obtained by imager 101 in first exposure period T1 is denoted by A0, the signal amount obtained by the camera in second exposure period T2 is denoted by A1, and the light speed (299, 792, 458 m/s) is denoted by c, distance d is given by the following formula.

$$d = c \times Tp/2 \times A1/(A0+A1).$$

A solid-state imaging device used in a distance measuring camera of the TOF method performs sampling for one cycle of irradiation light, a plurality of times.

$D=c \times Tp/2$, where $D$ denotes a distance measuring range.

In a TOF method (pulse TOF method, distance measuring method) used in Basic Mode 2, background light components and dark current components are taken into account. A first exposure period starting from a rise time of irradiation light with pulse width Tp of a light emission pulse is denoted by T1, a second exposure period starting from a fall time of the irradiation light is denoted by T2, the signal amount obtained by the camera in first exposure period T1 is denoted by A0, the signal amount obtained by the camera in second exposure period T2 is denoted by A1, and the light speed (299,792,458 m/s) is denoted by c. In an environment in which a signal contains a background light component from a light source (e.g. the sun) other than irradiation light or a dark current component of a charge accumulator, a third exposure period in which the near-infrared light source is off, denoted by T3, is set to the same length as pulse width $T_p$, and the signal amount obtained in third exposure period T3 is calculated as A2. When calculating distance d, A2 is subtracted in order to extract only distance information from each of A0 and A1. That is, $$d = c \times Tp/2 \times \{(A1-A2)/(A0-A2+A1-A2)\}.$$

As a pixel structure of solid-state imaging device 100, there is a method of allocating signal charges generated by a photoelectric converter to charge accumulators by a plurality of read gates.

Examples of charge accumulators include floating diffusion layers and charge coupled device memories (CCD memories). In a structure using a plurality of read gates, differences in read characteristics are caused by variations in the manufacturing process, bias of condensed light to a specific read gate, and the like. Moreover, crosstalk between pixels may occur, causing distance measuring errors.

Figure 2:
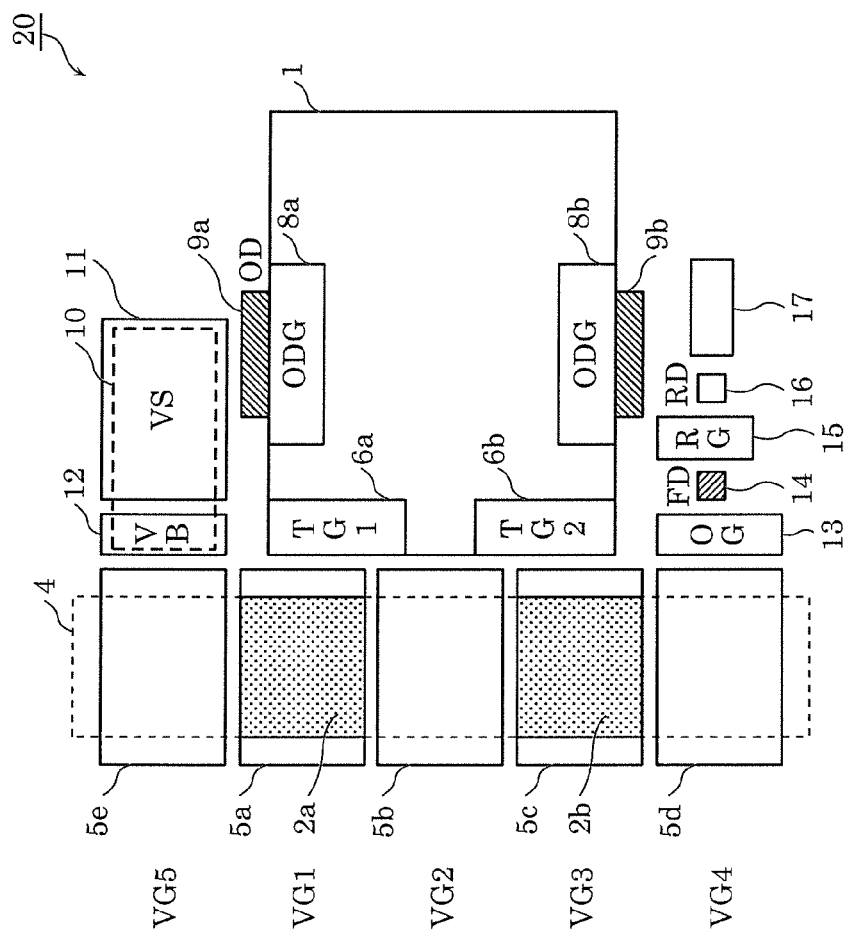
FIG. 2 is a schematic plan diagram illustrating a layout structure of a pixel included in a solid-state imaging device according to Basic Mode 1.

FIG. 2 is a schematic plan diagram illustrating a layout structure of pixel 20 included in solid-state imaging device 100 according to Basic Mode 1.

A plurality of pixels 20 are arranged in a matrix in a pixel region of the semiconductor substrate. Each pixel 20 includes photoelectric converter 1, a plurality of charge accumulators 2 (e.g. first charge accumulator 2a and second charge accumulator 2b), a plurality of read gates 6 (e.g. first read gate 6a and second read gate 6b), output control gate 13, floating diffusion layer 14, reset gate 15, reset drain 16, read circuit 17, a plurality of exposure control gates 8 (e.g. exposure control gates 8a and 8b), a plurality of overflow drains 9 (e.g. overflow drains 9a and 9b), and charge holder 10.

Photoelectric converter 1 converts received light into a signal charge.

Read gate 6 reads the signal charge from photoelectric converter 1.

Charge accumulator 2 accumulates the signal charge read by read gate 6. Charge accumulator 2 is composed of transfer channel (CCD channel) 4 located under a gate insulator and for transferring a signal charge, and transfer electrode 5 (e.g. any of transfer electrodes 5a, 5b, 5c, 5d, and 5e) located above the gate insulator. In detail, charge accumulator 2 includes a part of transfer channel 4 and a part of transfer electrode 5 that overlaps with the part of transfer channel 4 in a planar view of the semiconductor substrate, as illustrated in FIG. 2. The number of transfer channels 4 per one pixel is one, as illustrated in FIG. 2.

Voltages applied to transfer electrodes 5a, 5b, 5c, 5d, and 5e are hereafter denoted by VG1, VG2, VG3, VG4, and VG5, respectively.

First charge accumulator 2a and second charge accumulator 2b perform 5-phase drive. For example, first charge accumulator 2a and second charge accumulator 2b are formed adjacent to first read gate 6a and second read gate 6b respectively, under transfer electrodes 5 (under transfer electrodes 5a and 5c in this example) to which VG1 and VG3 that are high voltage during exposure are applied.

Overflow drain 9 discharges at least a part of the signal charge from photoelectric converter 1.

Exposure control gate 8 controls the discharge to overflow drain 9.

Charge holder 10 receives, from one of the plurality of charge accumulators 2 (first charge accumulator 2a and second charge accumulator 2b in this example), transfer of a signal charge accumulated in charge accumulator 2 and holds the signal charge, and transfers the held signal charge to one of the plurality of charge accumulators 2 (first charge accumulator 2a and second charge accumulator 2b in this example). As illustrated in FIG. 2, charge holder 10 includes charge holding gate 11 and transfer control gate 12 that performs transfer control of charge holder 10.

Floating diffusion layer 14 receives, from one of the plurality of charge accumulators 2 (first charge accumulator 2a and second charge accumulator 2b in this example), transfer of a signal charge accumulated in charge accumulator 2, and holds the signal charge.

Output control gate 13 controls transfer to floating diffusion layer 14.

Read circuit 17 converts the signal charge held in floating diffusion layer 14 into a voltage, and reads it out of pixel 20. For example, read circuit 17 includes a source follower transistor having a gate connected to floating diffusion layer 14, and a selection transistor connected in series to the source follower transistor. For example, as a result of the selection transistor selecting read circuit 17, the signal charge held in floating diffusion layer 14 is read out to AD converter 102 by read circuit 17.

First read gate 6a and second read gate 6b are vertically symmetric with respect to a center line dividing photoelectric converter 1 in the vertical direction (the column direction of the plurality of pixels 20 arranged in a matrix, i.e. the up-down direction in FIG. 2). In the plurality of pixels 20, a signal charge is read from photoelectric converter 1 by first read gate 6a and second read gate 6b in the same direction (i.e. leftward in FIG. 2) in the row direction in the matrix arrangement of the plurality of pixels 20, as illustrated in FIG. 2.

Likewise, exposure control gates 8a and 8b are vertically symmetric with respect to the center line dividing photoelectric converter 1 in the vertical direction (the column direction of the plurality of pixels 20 arranged in a matrix, i.e. the up-down direction in FIG. 2).

The vertically symmetric positional relationship between first read gate 6a and second read gate 6b and the vertically symmetric positional relationship between exposure control gates 8a and 8b are intended to match by design the characteristics of reading performed using two pairs of read gate 6 and exposure control gate 8.

Figure 3A:
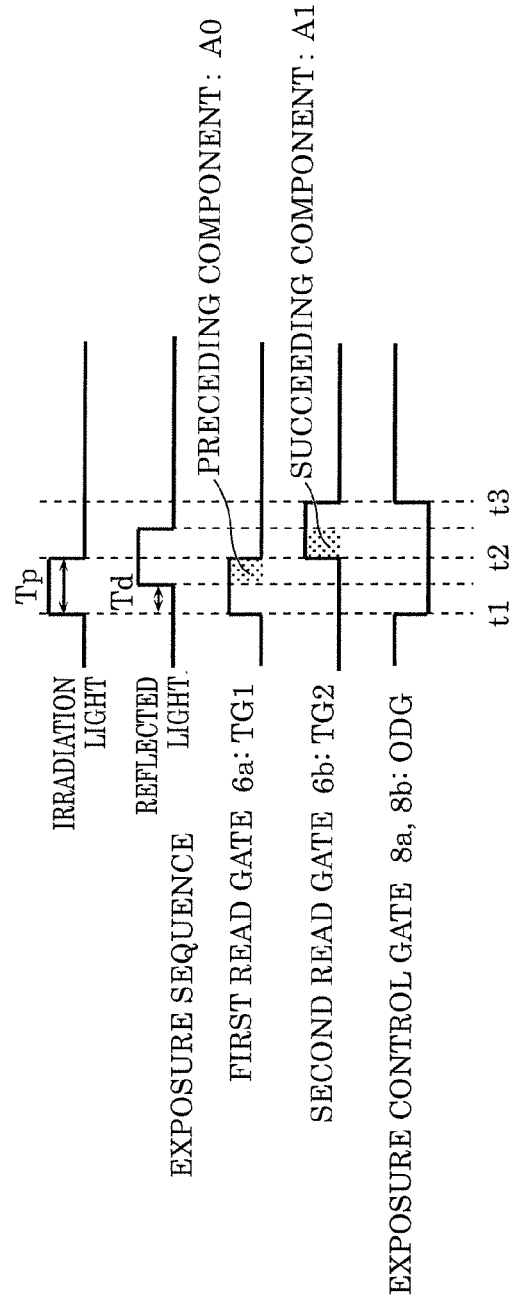
FIG. 3A is a drive timing chart illustrating operation of the solid-state imaging device according to Basic Mode 1 during exposure.
Figure 3B:
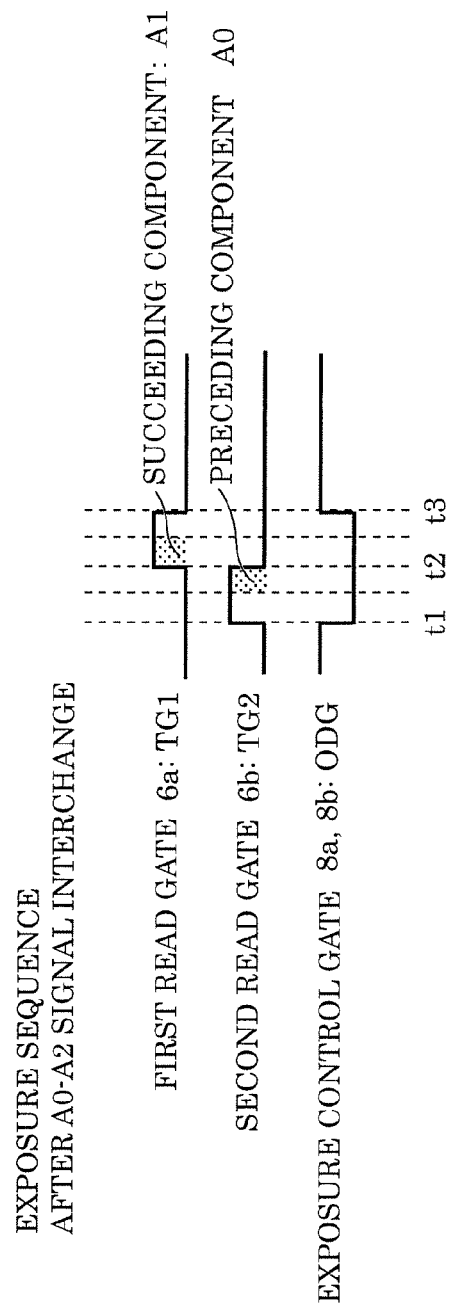
FIG. 3B is a drive timing chart illustrating operation of the solid-state imaging device according to Basic Mode 1 during exposure.

FIGS. 3A and 3B are each a drive timing chart illustrating operation of the solid-state imaging device according to Basic Mode 1 during exposure.

Operation during exposure will be described below, with reference to FIG. 3A.

Drive pulse ODG is applied to each of exposure control gates 8a and 8b, and drive pulses TG1 and TG2 are applied respectively to first read gate 6a and second read gate 6b. Drive pulses VG1 to VG5 are applied respectively to transfer electrodes 5a to 5e, although not illustrated in FIG. 3A. During exposure, high voltage is applied to VG1 and VG3, and low voltage is applied to the other transfer electrodes. Charge accumulation under each transfer electrode 5 to which high voltage is applied is possible. In detail, each transfer electrode 5 (transfer electrodes 5a and 5c in this example) to which high voltage is applied and transfer channel 4 overlapping with transfer electrode 5 from below form charge accumulator 2 (first charge accumulator 2a and second charge accumulator 2b in this example). Light source 500 repeatedly applies near-infrared pulse light that alternates between on and off in a constant cycle. Tp denotes the pulse width of the irradiation pulse light. The near-infrared pulse light reflected from the object reaches imager 101 with delay Td depending on the distance from light source 500, and is converted into a signal charge in photoelectric converter 1.

In an initial state, ODG is in high state, and photoelectric converter 1 is in reset state. Moreover, first read gate 6a and second read gate 6b are in low state, and first charge accumulator 2a and second charge accumulator 2b in which transfer electrodes 5a and 5c are held in high state and photoelectric converter 1 are electrically disconnected. In this state, the signal charge generated in photoelectric converter 1 is discharged to overflow drain 9 via exposure control gate 8, without being accumulated in photoelectric converter 1.

Next, at time t1 at which the irradiation pulse light is turned on, ODG is driven to low state, and the discharge of the charge from photoelectric converter 1 to overflow drain 9 is stopped. At this time, first read gate 6a transitions from low state to high state. The transfer of the signal charge generated as a result of the incidence of the reflected pulse light to first charge accumulator 2a via first read gate 6a is started, and a preceding component (A0) of the reflected pulse light is held in first charge accumulator 2a.

Next, second read gate 6b transitions from low state to high state. The transfer of the signal charge generated as a result of the incidence of the reflected pulse light to second charge accumulator 2b via second read gate 6b is started, and a succeeding component (A1) of the reflected pulse light is held in second charge accumulator 2b.

Thus, first read gate 6a and second read gate 6b respectively read a first signal charge (the preceding component (A0) of the reflected pulse light) and a second signal charge (the succeeding component (A1) of the reflected pulse light) with a first phase difference, in the exposure period in one frame period.

With the foregoing conventional technique, the pulse timings of TG1 and TG2 are interchanged for each frame. In Basic Mode 1, pixel 20 includes charge holder 10. Hence, by interchanging distance-measuring signals A0 and A1 in position during exposure and, after the interchange, interchanging pulses TG1 and TG2, differences in characteristics depending on the read position and the position of charge accumulator 2 can be suppressed in one frame.

The operation will be described below.

Figure 4:
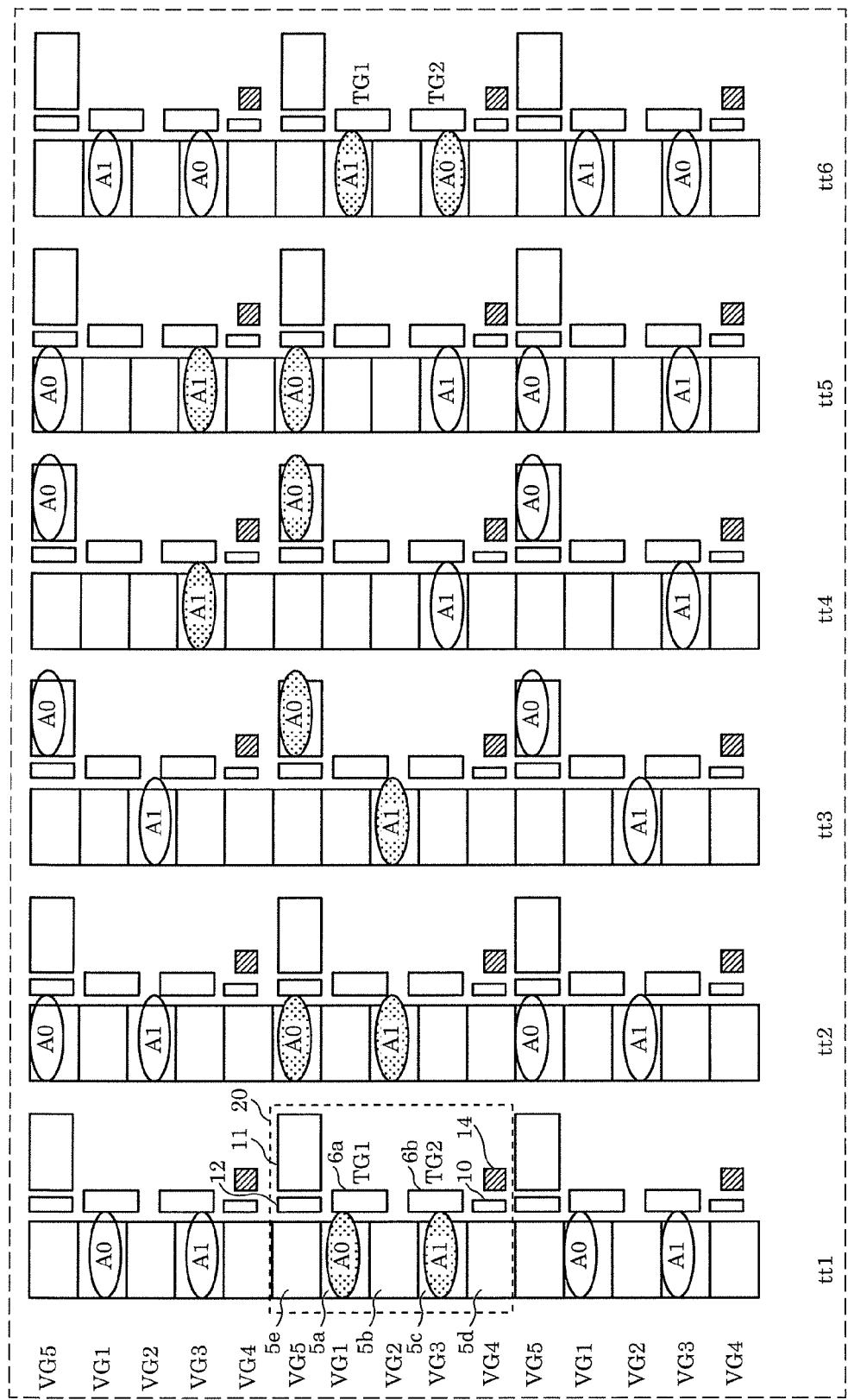
FIG. 4 is a schematic plan diagram illustrating signal interchange operation of the solid-state imaging device according to Basic Mode 1.

FIG. 4 is a schematic plan diagram illustrating signal interchange operation of solid-state imaging device 100 according to Basic Mode 1.

Figure 5:
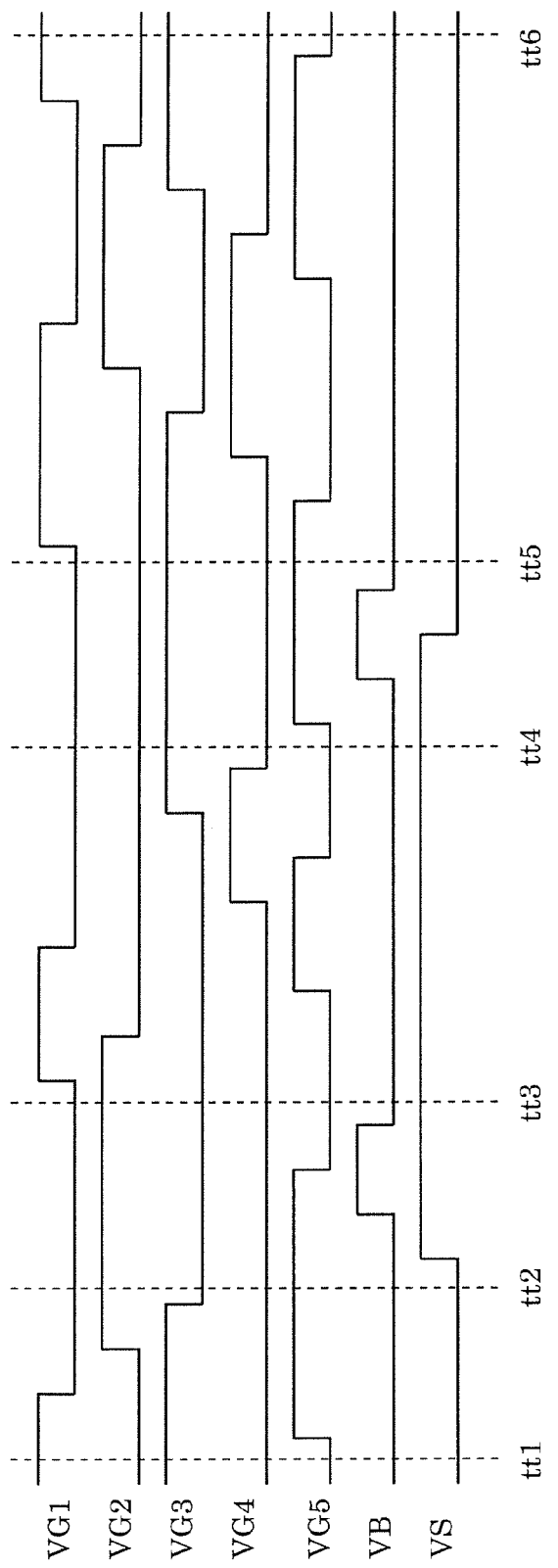
FIG. 5 is a drive timing chart illustrating signal interchange operation of the solid-state imaging device according to Basic Mode 1.

FIG. 5 is a drive timing chart illustrating signal interchange operation of solid-state imaging device 100 according to Basic Mode 1.

In FIG. 4, drive pulses VG1 to VG5 are applied to respective transfer electrodes 5, to transfer a signal charge to a desired location. Drive pulse VS is applied to charge holding gate 11, and drive pulse VB is applied to transfer control gate 12. To clearly indicate signal positions, only for signals A0 and A1 generated in center pixel 20 in each column, the background of the characters is filled with dots.

Here, drive pulses VG1 to VG5 applied to transfer electrodes 5a to 5e, drive pulse VS applied to charge holding gate 11, and drive pulse VB applied to transfer control gate 12 are output from timing generator 103.

tt1 is a timing (i.e. t3) at which the exposure illustrated in FIG. 3A ends, and signals A0 and A1 are accumulated under respective transfer electrodes 5 to which VG1 and VG3 driven to high voltage are applied. After this, the charges are transferred by 5-phase drive in the upward direction in FIG. 4.

Next, at tt2, VG2 and VG5 are driven to high voltage, and signal charges are accumulated under respective transfer electrodes 5 to which VG2 and VG5 are applied. Following this, VS is driven to high voltage and then VB is driven to high voltage as illustrated in FIG. 5, to form a charge transfer path between charge accumulator 2 of transfer electrode 5 to which VG5 is applied and charge holder 10. After this, low voltage is applied sequentially to transfer electrode 5 and transfer control gate 12 to which VG5 and VB are applied, to transfer signal A0 to under charge holding gate 11 (tt3 in FIGS. 4 and 5). Timing generator 103 thus outputs a first signal for transferring, from one of the plurality of charge accumulators 2, the signal charge accumulated in charge accumulator 2 to charge holder 10.

Next, signal A1 located below signal A0 under charge holding gate 11 at tt3 is transferred upward by 5-phase drive over charge holding gate 11, and accumulated under transfer electrode 5 to which VG3 is applied (tt4).

Subsequently, VG5 and VB are driven to high voltage again, to form a transfer path between charge holder 10 and charge accumulator 2 of transfer electrode 5 to which VG5 is applied. After this, low voltage is applied in the order of VS and VB, to transfer signal A0 to under transfer electrode 5 to which VG5 that is high voltage is applied (tt5). Timing generator 103 thus generates a second signal for transferring, from charge holder 10, the held signal charge to one of the plurality of charge accumulators 2.

Next, transfer is performed by 5-phase drive in the downward direction, to create a state in which A0 and A1 are interchanged in vertical position (tt6). This series of operation is hereafter referred to as "interchange operation". Thus, by outputting a plurality of signals including the first signal and the second signal, timing generator 103 interchanges the position of first charge accumulator 2a that accumulates the first signal charge (A0) and the position of second charge accumulator 2b that accumulates the second signal charge (A1) in the case where the first signal charge (A0) is read by first read gate 6a and the second signal charge (A1) is read by second read gate 6b.

After this interchange operation, signal A1 is located beside first read gate 6a to which TG1 is applied, and signal A0 is located beside second read gate 6b to which TG2 is applied, as illustrated in FIG. 4. Accordingly, the pulse timings of pulses applied to TG1 and TG2 can be interchanged to start exposure again, as illustrated in FIG. 3B. In detail, after the interchange operation described above, first read gate 6a and second read gate 6b can respectively read a signal charge to second charge accumulator 2b and a signal charge to first charge accumulator 2a with a second phase difference that differs by 180 degrees in phase from the first phase difference, in the exposure period. Herein, the expression "different by 180 degrees in phase" means that the phase relationship between the drive pulse applied to TG1 and the drive pulse applied to TG2 in FIG. 3A and the phase relationship between the drive pulse applied to TG1 and the drive pulse applied to TG2 in FIG. 3B have opposite-phase timings.

In the exposure before the interchange, $$A0=A0(TG1)$$

$$A1=A1(TG2)$$

where (TG1) and (TG2) respectively denote that the signals are read by first read gate 6a and second read gate 6b to which TG1 and TG2 are applied.

In the exposure after the interchange, $$A0=A0(TG2)$$

$$A1=A1(TG1).$$

Addition of each of A0 and A1 yields $$A0=A0(TG1)+A0(TG2)$$

$$A1=A1(TG1)+A1(TG2).$$

Each of A0 and A1 evenly includes the components read by first read gate 6a and second read gate 6b to which TG1 and TG2 are applied, and also the charge accumulation positions are evenly separated. Therefore, even in the case where two read gates 6 and charge accumulators 2 are provided, signal differences due to differences in read location and charge accumulation position in the exposure period in one frame can be canceled out.

Figure 6:
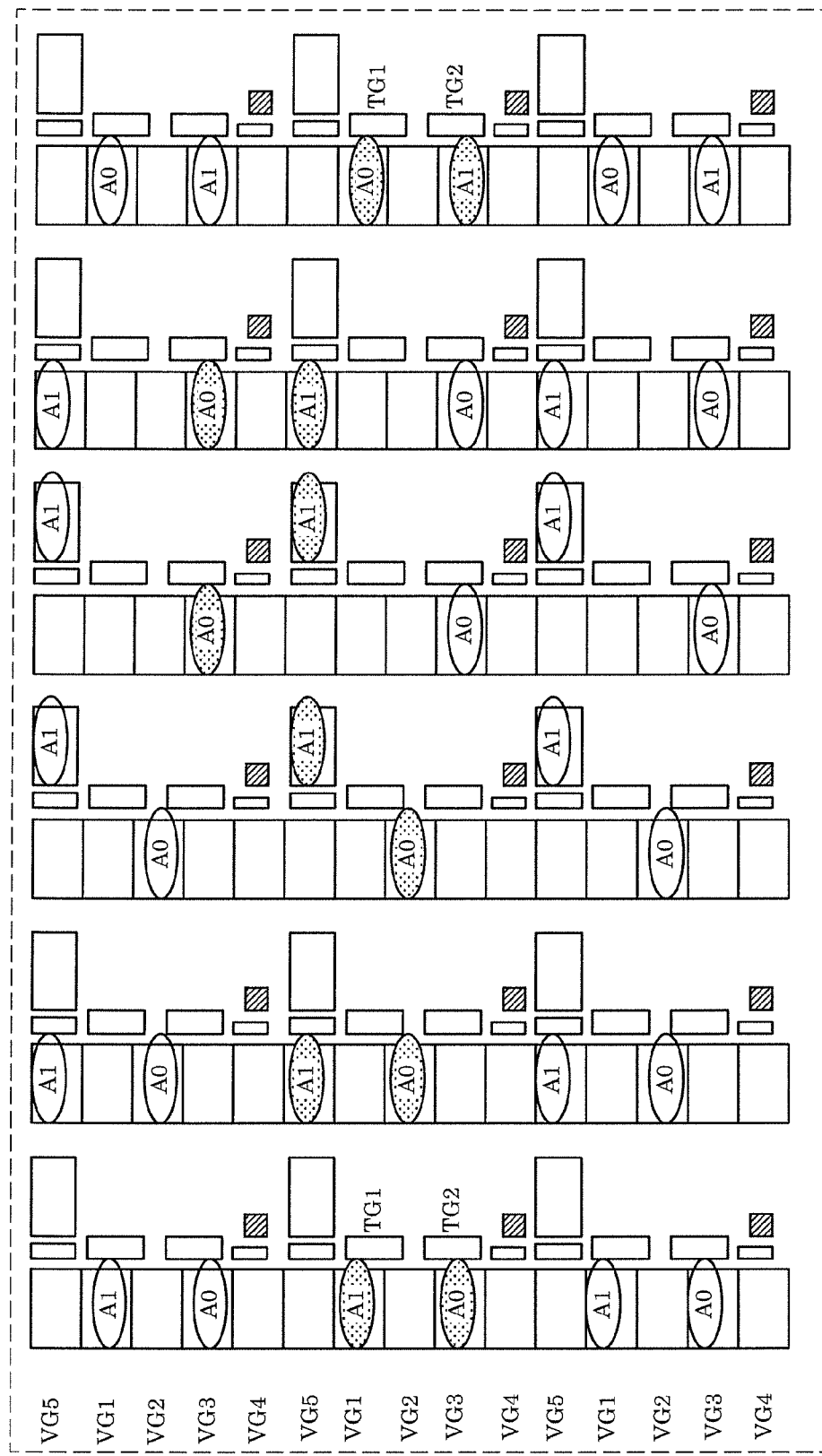
FIG. 6 is a schematic plan diagram illustrating signal interchange operation of the solid-state imaging device according to Basic Mode 1.

FIG. 6 is a schematic plan diagram illustrating signal interchange operation of solid-state imaging device 100 according to Basic Mode 1.

Performing the interchange operation illustrated in FIG. 6 following the exposure after the interchange operation illustrated in FIG. 4 enables return to the initial state (tt1) in FIG. 4. It is desirable to reduce bias in signal in the time axis by repeatedly performing the exposure in FIG. 3A, the interchange operation in FIG. 4, the exposure in FIG. 3B, and the interchange operation in FIG. 6 a plurality of times.

As described in detail above, according to Basic Mode 1, differences in characteristics due to the positions of read gates 6 and charge accumulators 2 can be suppressed without using a plurality of frames, so that a distance-measuring solid-state imaging device having excellent distance measuring accuracy can be provided.

(Basic Mode 2 of the Present Disclosure)

A solid-state imaging device according to Mode 2 (Basic Mode 2) forming basis of the present disclosure and a drive method of the solid-state imaging device will be described below, mainly focusing on differences from Basic Mode 1.

Figure 7:
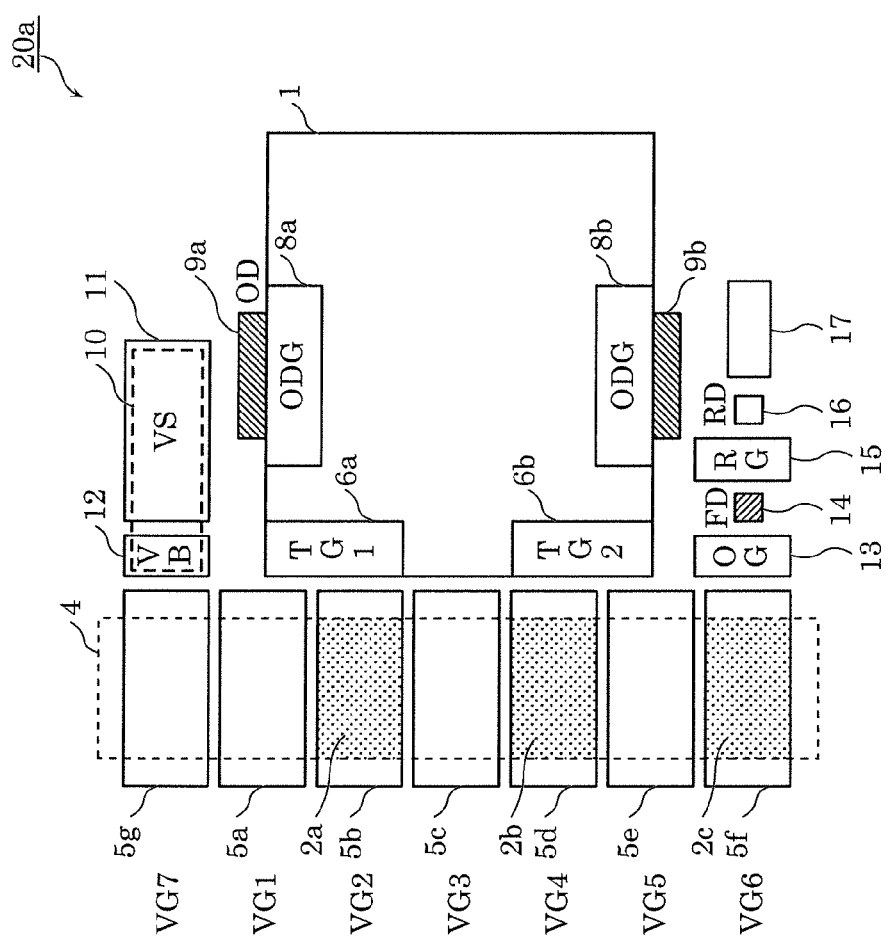
FIG. 7 is a schematic plan diagram illustrating a layout structure of a pixel included in a solid-state imaging device according to Basic Mode 2.

FIG. 7 is a schematic plan diagram illustrating a layout structure of pixel 20a included in the solid-state imaging device according to Basic Mode 2. The solid-state imaging device according to Basic Mode 2 differs from Basic Mode 1 in that seven transfer electrodes 5 are arranged. Hence, three charge accumulators 2 can be provided, as compared with Basic Mode 1. As illustrated in FIG. 7, pixel 20a includes third charge accumulator 2c in addition to first charge accumulator 2a and second charge accumulator 2b.

In solid-state imaging device 100 according to Basic Mode 1, the number of charge accumulators 2 is two.

In Basic Mode 2, on the other hand, one charge accumulator 2 for independently obtaining a signal not including distance information, such as background light and dark current and parasitic sensitivity components generated in charge accumulator 2, is added. While suppressing differences in characteristics between distance-measuring signals (signal charges) obtained via two read gates in one frame as in Basic Mode 1, distance measuring errors are reduced by removing, in distance calculation, a background light component (hereafter, BG) and a dark current component (hereafter, DS) and a parasitic sensitivity component (hereafter, Sm) generated in charge accumulator 2. To do so, seven electrodes (transfer electrodes 5a to 5g) forming charge coupled devices are provided to enable 7-phase drive as illustrated in FIG. 7, thus increasing the number of signal charges that can be accumulated to three. 8-phase drive is also possible.

The operation will be described below.

After performing interchange operation during exposure, the timings of pulses applied to TG1 and TG2 are interchanged to suppress differences in read characteristics, as in Basic Mode 1. In addition, given that dark current component DS and parasitic sensitivity Sm differ among the plurality of charge accumulators 2, the dark current component and parasitic sensitivity of first charge accumulator 2a are denoted by DS1 and Sm1, the dark current component and parasitic sensitivity of second charge accumulator 2b are denoted by DS2 and Sm2, and the dark current component and parasitic sensitivity of third charge accumulator 2c are denoted by DS3 and Sm3, to distinguish them.

Moreover, signal charges by dark current and parasitic sensitivity also occur in charge holder 10, as in charge accumulator 2. These components are accordingly denoted by DSX and SmX. In signal charge interchange operation, charges by dark current DSX and parasitic sensitivity SmX mix into the signal charge that is transferred to charge holder 10 first. Hence, in the case where there are three signals A0, A1, and A2, the three signals need to be equal in the number of times the charge is transferred to charge holder 10 first among the three signals.

Furthermore, the times during which A0, A1, and A2 remain in respective three charge accumulators 2 need to be equal.

Figure 8A:
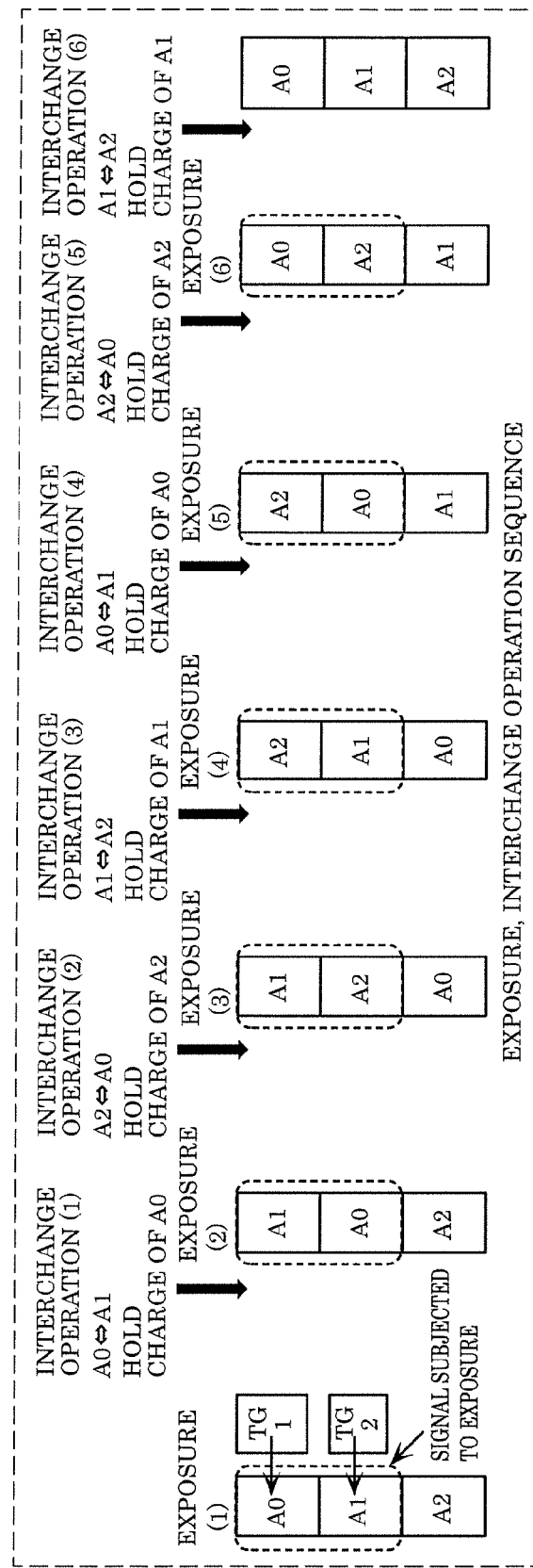
FIG. 8A is a drive timing chart illustrating arrangement of each signal and operation of the solid-state imaging device according to Basic Mode 2 during exposure.
Figure 8B:
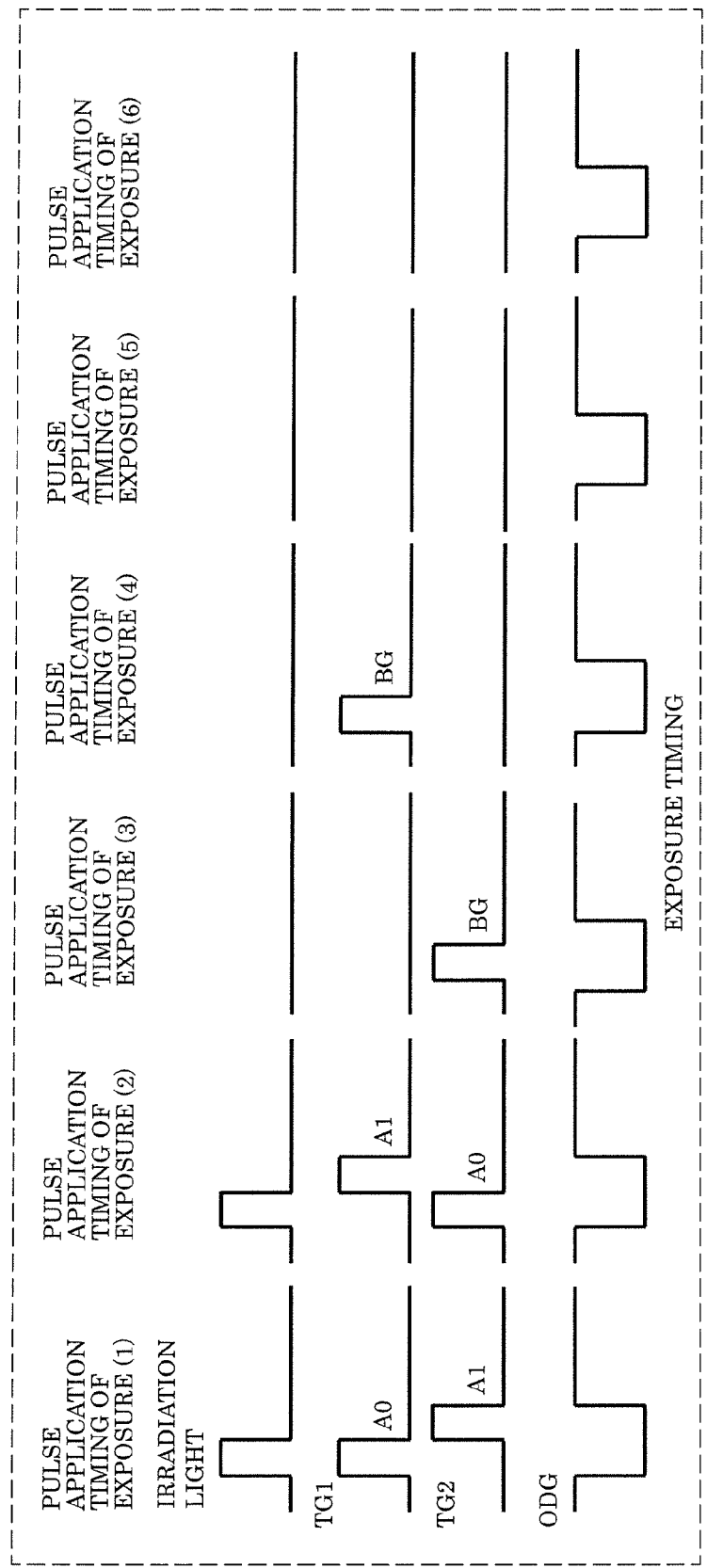
FIG. 8B is a drive timing chart illustrating arrangement of each signal and operation of the solid-state imaging device according to Basic Mode 2 during exposure.

FIGS. 8A and 8B are each a drive timing chart illustrating arrangement of each signal and operation of the solid-state imaging device according to Basic Mode 2 during exposure. FIG. 8A illustrates an exposure and interchange operation sequence. FIG. 8B illustrates exposure timing. For simplicity, transfer electrodes 5 are omitted, and only first charge accumulator 2a, second charge accumulator 2b, third charge accumulator 2c, and signals accumulated in charge accumulator 2a to 2c are illustrated.

In Basic Mode 2, to evenly distribute, among signals, differences in read characteristics, dark current differences and parasitic sensitivity differences of charge accumulators 2, and dark current and parasitic sensitivity of charge holder 10 mixed in each signal in interchange operation, an exposure period is made up of exposures (1) to (6) and interchange operations (1) to (6), as illustrated in FIG. 8A. Exposures (1) to (6) have the same exposure time. For interchange operation of two signals, one of the signals needs to be transferred to charge holder 10. Interchange operations (1) to (6) differ in which signal is transferred to charge holder 10. FIG. 8A also illustrates such signal transferred to charge holder 10.

In first exposure (1), components A0, A1, and A2 are expressed by the following formulas.

$A0 = A0(TG1) + DS1 + Sm1$ $A1 = A1(TG2) + DS2 + Sm2$ $A2 = DS3 + Sm3$ where (TG1) and (TG2) respectively denote that the signals are read by first read gate 6a to which TG1 is applied and second read gate 6b to which TG2 is applied, as in Basic Mode 1.

Between interchange operation (1) and exposure (2), dark current DSX and parasitic sensitivity SmX of charge holder 10 are added to A0 because signal A0 is transferred to charge holder 10 in interchange operation (1), as follows:

$A0 = A0(TG2) + DS2 + Sm2 + DSX + SmX$ $A1 = A1(TG1) + DS1 + Sm1$ $A2 = DS3 + Sm3.$

Between interchange operation (2) and exposure (3), dark current DSX and parasitic sensitivity SmX of charge holder 10 are added to A2 because signal A2 is transferred to charge holder 10 in interchange operation (2). Moreover, in exposure (3), light emission by light source 500 is not performed, and the only read pulse is TG2 and background light component (BG) is read. Accordingly, $A0 = DS3 + Sm3$ $A1 = DS1 + Sm1$ $A2 = BG(TG2) + DS2 + Sm2 + DSX + SmX.$ Between interchange operation (3) and exposure (4), dark current DSX and parasitic sensitivity SmX of charge holder 10 are added to A1 because signal A1 is transferred to charge holder 10 in interchange operation (3). Moreover, in exposure (4), light emission by light source 500 is not performed, and the only read pulse is TG1 and background light component (BG) is read. Accordingly, $A0 = DS3 + Sm3$ $A1 = DS2 + Sm2 + DSX + SmX$ $A2 = BG(TG1) + DS1 + Sm1.$ Between interchange operation (4) and exposure (5), dark current DSX and parasitic sensitivity SmX of charge holder 10 are added to A0 because signal A0 is transferred to charge holder 10 in interchange operation (4). Moreover, in exposure (5), light emission by light source 500 is not performed, and no read pulse is applied. Accordingly, $A0 = DS2 + Sm2 + DSX + SmX$ $A1 = DS3 + Sm3$ $A2 = DS1 + Sm1.$ Between interchange operation (5) and exposure (6), dark current DSX and parasitic sensitivity SmX of charge holder 10 are added to A2 because signal A2 is transferred to charge holder 10 in interchange operation (5). Moreover, in exposure (6), light emission by light source 500 is not performed, and no read pulse is applied. Accordingly, $A0 = DS1 + Sm1$ $A1 = DS3 + Sm3$ $A2 = DS2 + Sm2 + DSX + SmX.$ After interchange operation (6), dark current DSX and parasitic sensitivity SmX of the charge holder are added to A1 because signal A1 is transferred to charge holder 10 in interchange operation (6). Moreover, exposure is not performed, so that other parasitic sensitivity and dark current are substantially negligible, and are taken to be 0. Accordingly, $$A0=0$$

$$A1=DSX+SmX$$

$$A2=0$$

are accumulated in A0, A1, and A2.

Adding the foregoing for each of A0, A1, and A2 yields $$A0=A0(TG1)+A0(TG2)+2\times DS1+2\times Sm1+2\times DS2+2\times Sm2+2\times DS3+2\times Sm3+2\times DSX+2\times SmX$$

$$A1=A1(TG1)+A1(TG2)+2\times DS1+2\times Sm1+2\times DS2+2\times Sm2+2\times DS3+2\times Sm3+2\times DSX+2\times SmX.$$

$$A2=BG(TG1)+BG(TG2)+2\times DS1+2\times Sm1+2\times DS2+2\times Sm2+2\times DS3+2\times Sm3+2\times DSX+2\times SmX.$$

Since signals A0, A1, and BG read by two different read gates 6 are included in A0, A1, and A2 in an added state, differences in read characteristics are canceled out.

Moreover, since dark current and parasitic sensitivity for three charge accumulators 2 and charge holder 10, such as DS1, Sm1, DS2, Sm2, DS3, Sm3, DSX, and SmX, are evenly included in A0, A1, and A2, these signals not related to distance information are not included in calculated differences A0−A2 and A1−A2. Further, given that each exposure time is set to be equal, the background light component included in each of A0(TG1)+A0(TG2) and A1(TG1)+A1(TG2) is equal to BG(TG1)+BG(TG2), and, after calculating the differences, only distance information is obtained. Distance measuring errors can thus be suppressed.

To reduce dark current of charge holder 10, it is desirable to apply a negative voltage to charge holding gate 11 and transfer control gate 12 forming charge holder 10 to cause pinning of the interface of the transfer channel, except when transferring and accumulating a signal charge in interchange operation. In detail, it is desirable that charge holder 10 includes at least a part of a charge holding channel (not illustrated) and at least a part of charge holding gate 11 overlapping with the at least a part of the charge holding channel in a planar view of the semiconductor substrate, and a negative voltage is applied to charge holding gate 11 to cause pinning of the interface between the charge holding channel and charge holding gate 11 in at least a part of a period except a period in which charge holder 10 holds the signal charge.

Moreover, to reduce parasitic sensitivity, it is desirable to provide a light shielding film to cover the whole or part of the periphery of charge holding gate 11 and transfer control gate 12, via an insulating film. In detail, it is desirable to cover at least a part of charge holder 10 with a light shielding film. In an MOS process, wiring is provided at a high position from a gate electrode. Therefore, parasitic sensitivity can be reduced by shielding light by W (tungsten) or the like at a low position separate from the wiring.

Although charge holder 10 is provided within one pixel in FIG. 7, sharing charge holder 10 by a plurality of pixels can reduce parasitic sensitivity and dark current mixing into a signal charge in interchange operation to "1/(the number of sharing pixels)", as compared with the case where charge holder 10 is not shared. This suppresses a shot noise increase when calculating differences A0−A2 and A1−A2, and reduces distance measuring variations.

FIGS. 8A and 8B concern only the exposure period. However, since respective signals are accumulated in different charge accumulators during a signal read period following the exposure period in one frame period, dark current differences and parasitic sensitivity differences occur in this period, too.

By performing interchange operations (1) to (6) in the signal read period as in the exposure period, dark current and parasitic sensitivity differences which occur in different charge accumulators during this period can also be made equal.

In this case, since only signal reading is performed, read pulses TG1 and TG2 in FIG. 8B are unnecessary, and TG1 and TG2 may be constantly in low state, and ODG may be constantly in high state.

As described in detail above, according to Basic Mode 2, differences in characteristics due to the positions of read gates 6 can be suppressed without using a plurality of frames, and differences in background light, dark current, and parasitic sensitivity among signals can be suppressed and subtracted, so that a distance-measuring solid-state imaging device having excellent distance measuring accuracy can be provided.

(Basic Mode 3 of the Present Disclosure)

Figure 9:
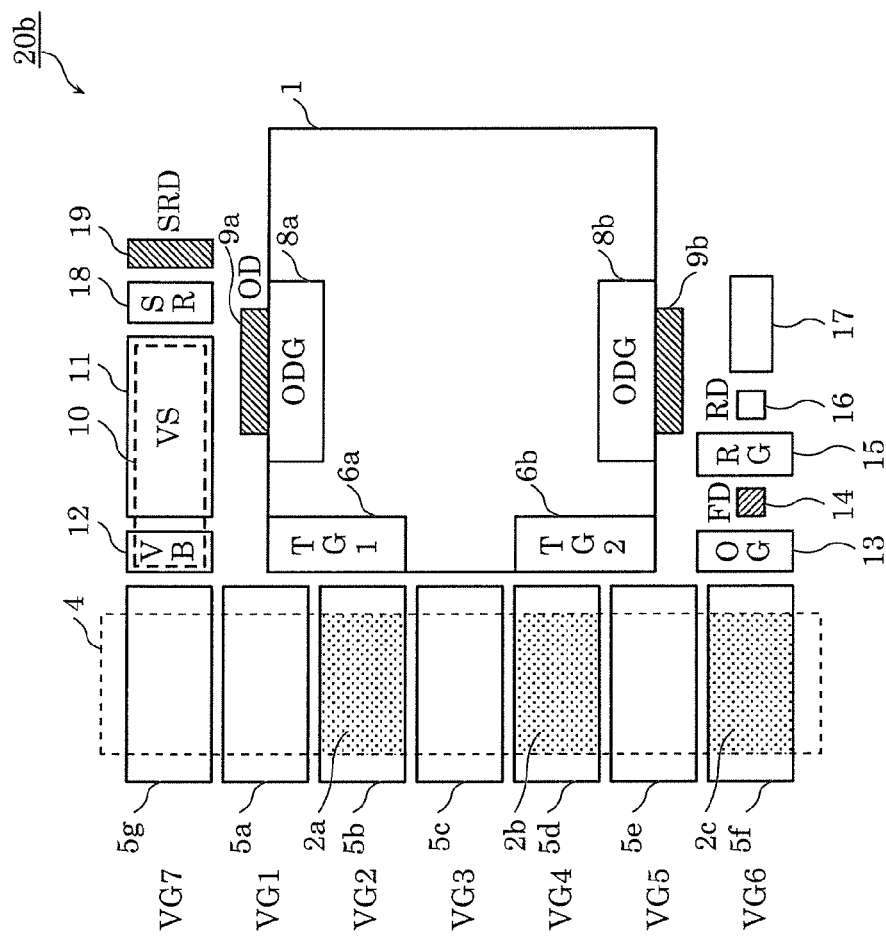
FIG. 9 is a schematic plan diagram illustrating a layout structure of a pixel included in a solid-state imaging device according to Basic Mode 3.

FIG. 9 is a schematic plan diagram illustrating a layout structure of pixel 20b included in a solid-state imaging device according to Mode 3 (Basic Mode 3) forming basis of the present disclosure. As illustrated in FIG. 9, pixel 20b includes charge holder reset gate 18 and charge holder reset drain 19. The solid-state imaging device according to Basic Mode 3 differs from Basic Mode 2 in that charge holder reset gate 18 and charge holder reset drain 19 are added. Accordingly, charge holder reset gate 18 and charge holder reset drain 19 will be mainly described below, while omitting description of other parts as already described.

In both Basic Mode 1 and Basic Mode 2, it is desirable to set the amount of charge handled by charge holder 10 to be larger than the amount of charge handled by charge accumulator 2, to prevent overflow. However, for example in the case where parasitic sensitivity (SmX) and dark current (DSX) in charge holder 10 are large, it is desirable to add charge holder reset gate 18 and charge holder reset drain 19 that are adjacent to charge holder 10 and control charge accumulation in charge holder 10 and discharge to the drain, that is, charge holder reset drain 19 that discharges at least a part of the signal charge from charge holder 10 and charge holder reset gate 18 that controls the discharge to charge holder reset drain 19, to suppress overflow of charge holder 10.

In addition, by turning on charge holder reset gate 18 before interchange operation to discharge components DSX and SmX accumulated during the exposure period or the signal read period to charge holder reset drain 19, mixing of components DSX and SmX into signals such as A0, A1, and BG transferred to charge holder 10 in the interchange operation can be reduced. This suppresses an increase of shot noise in the subtraction process, and reduces distance measuring variations.

Further, by setting the channel potential when applying low voltage to transfer control gate 12 to be deeper by a predetermined amount than the channel potential when applying low voltage to transfer electrode 5 on transfer channel 4 and setting high voltage to charge holder 10 and charge holder reset gate 18, overflow of charge accumulator 2 formed by a charge coupled device can be reduced, too.

As described in detail above, mixing of dark current and parasitic sensitivity of charge holder 10 into signals necessary for distance calculation can be suppressed, in addition to the effects of Basic Mode 2. A distance-measuring solid-state imaging device having more excellent distance measuring accuracy can thus be provided.

Embodiment 1

Figure 10A:
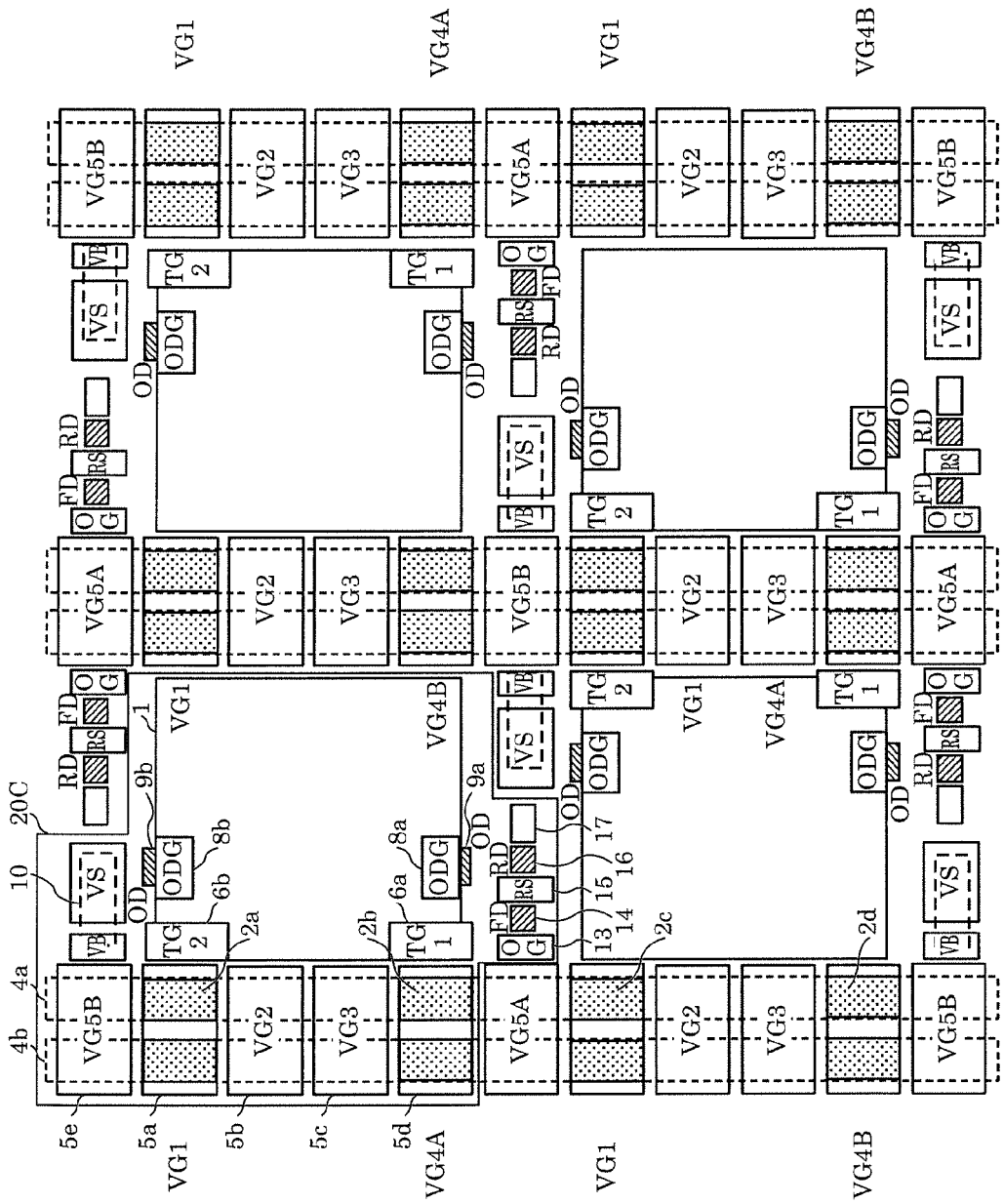
FIG. 10A is a schematic plan diagram illustrating a layout structure of a pixel included in a solid-state imaging device according to Embodiment 1.
Figure 10B:
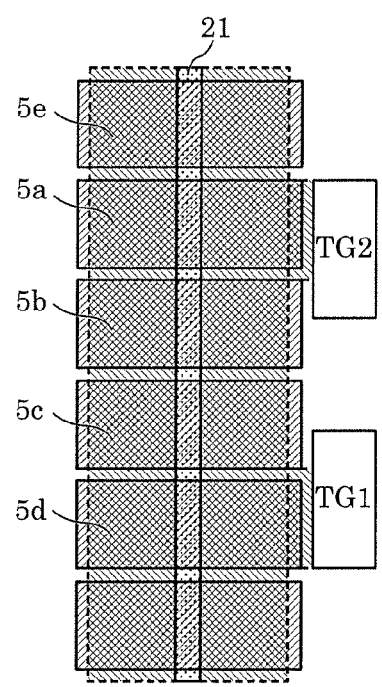
FIG. 10B is a schematic plan diagram illustrating a layout structure of a pixel included in the solid-state imaging device according to Embodiment 1.
Figure 10C:
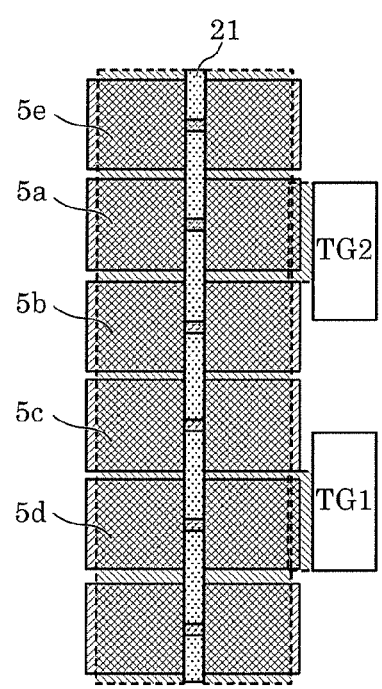
FIG. 10C is a schematic plan diagram illustrating a layout structure of a pixel included in the solid-state imaging device according to Embodiment 1.

FIGS. 10A, 10B, and 10C are each a schematic plan diagram illustrating a layout structure of pixel 20c included in a solid-state imaging device according to Embodiment 1 of the present disclosure.

As illustrated in FIG. 10A, the solid-state imaging device according to this embodiment differs from Basic Mode 2 in that the number of transfer channels 4 (CCD channels) per one pixel is two or more (e.g. two: transfer channels 4a and 4b), output control gate 13, floating diffusion layer 14, reset gate 15, reset drain 16, charge holder 10, and read circuit 17 are shared by two pixels in the vertical direction, and four charge accumulators 2, i.e. first charge accumulator 2a, second charge accumulator 2b, third charge accumulator 2c, and fourth charge accumulator 2d, are included per one pixel. The structural elements are the same as above, and accordingly their description is omitted as already described.

To isolate transfer channels 4a and 4b from each other, impurities are injected in high concentration to form channel stop region 21, or shallow trench isolation (STI) is used, as illustrated in FIGS. 10B and 10C. For example, the former structure may use transfer electrode 5 of a rectangular shape illustrated in FIG. 10B in the case where high voltage is applied to transfer electrode 5. However, transfer electrode 5 of a rectangular shape overlaps in a large part with channel stop region 21 in a planar view of the semiconductor substrate, which can facilitate dark current caused by a high electric field.

It is therefore desirable to reduce the overlap between channel stop region 21 and transfer electrode 5. For example, it is desirable to employ layout in which the transfer electrode length on channel stop region 21 is shorter than the transfer electrode length on transfer channel 4. An example achieving such layout is transfer electrode 5 of a dumbbell shape illustrated in FIG. 10C.

The solid-state imaging device according to Basic Mode 2 can handle three signals, one of which is a signal for subtracting background light (BG), dark current (DS), and parasitic sensitivity (Sm) from distance signals A0 and A1.

In this embodiment, on the other hand, a plurality of (e.g. two) transfer channels 4 are provided to enable 5-phase drive, so that four distance measuring signals can be handled per one pixel. Hence, the distance measuring range can be extended three times, with narrow pulse width. Further, while the parasitic sensitivity and dark current component of charge holder 10 mix in a state of being divided among three signals in Basic Mode 2, the parasitic sensitivity and dark current component of charge holder 10 mix in a state of being divided among four signals in this embodiment. This is advantageous in that their influence is reduced.

The operation will be described below.

FIGS. 11A and 11B are each a drive timing chart illustrating operation of the solid-state imaging device according to Embodiment 1 during exposure. There are two different types of exposure timing. Hereafter, the exposure timing illustrated in FIG. 11A is referred to as "first sequence", and the exposure timing illustrated in FIG. 11B is referred to as "second sequence". Signals A0 and A2 are obtained in the first sequence, and signals A1 and A3 are obtained in the second sequence. This will be described in detail later.

Figure 12:
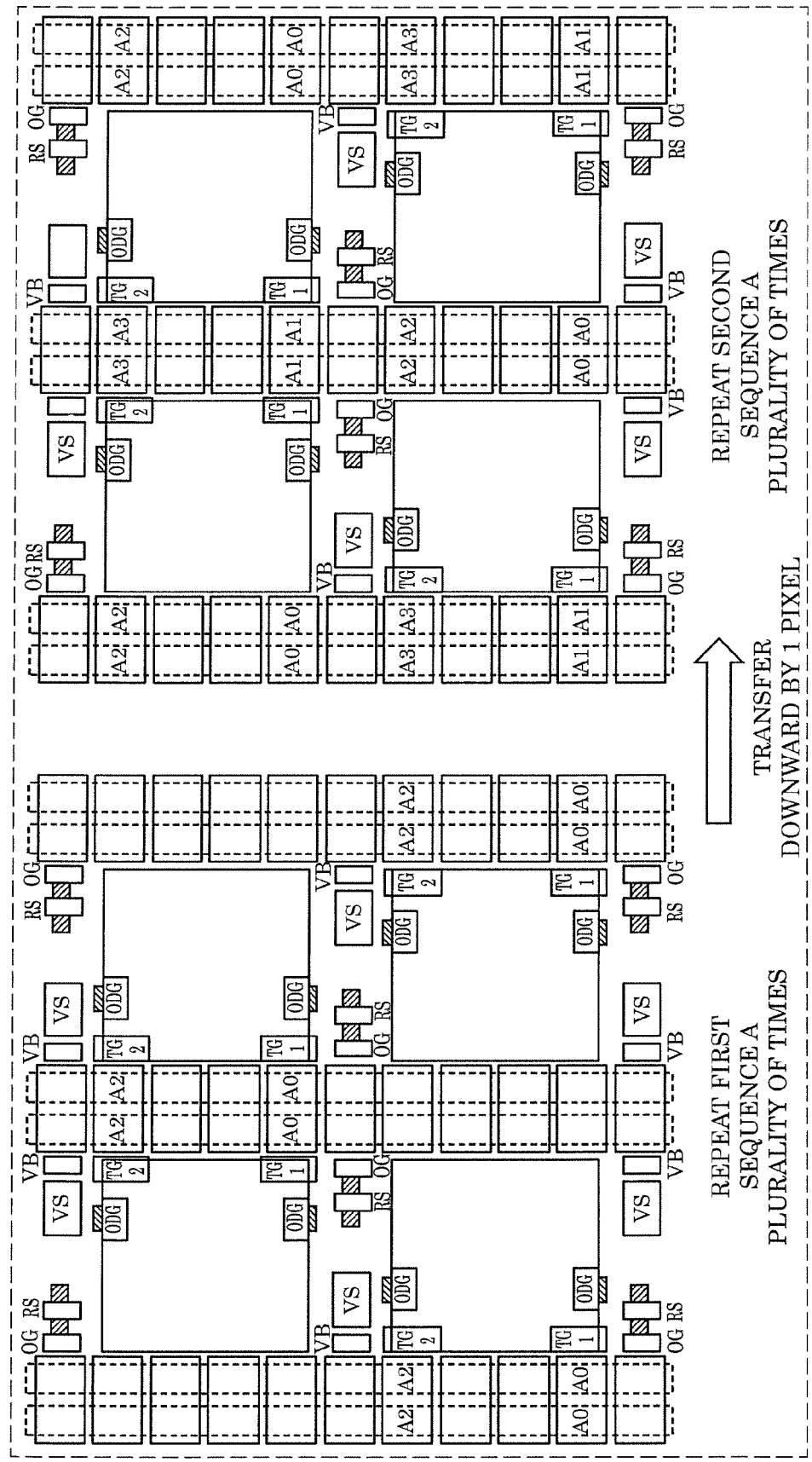
FIG. 12 is a schematic plan diagram illustrating signal operation of the solid-state imaging device according to Embodiment 1 during exposure.

FIG. 12 is a schematic plan diagram illustrating signal operation of the solid-state imaging device according to Embodiment 1 during exposure. To accumulate four signals, after performing the first sequence, signals A0 and A2 are transferred downward in FIG. 12 by one pixel, and then the second sequence is performed to accumulate signals A1 and A3 via read gates 6a and 6b. In the case where interchange operation is not performed, after performing the second sequence, the signals are transferred upward by one pixel, and then the first sequence is performed again. This is repeated a plurality of times, to suppress an excessive time difference between the exposure period of A0 and A2 and the exposure period of A1 and A3.

The exposure operation will be described in detail below, with reference to FIGS. 11A and 11B.

In an initial state, drive pulse signal ODG applied to exposure control gates 8a and 8b is in high state, and a signal charge generated in photoelectric converter 1 is discharged to overflow drains 9a and 9b via exposure control gates 8a and 8b respectively, without being accumulated in photoelectric converter 1. Drive pulse signals TG1 and TG2 are in low state. Moreover, drive pulse signals VG1 and VG4 applied to transfer electrodes 5 adjacent to read gates 6a and 6b are in high state, forming charge accumulators 2 (not illustrated in FIGS. 11A and 11B). These charge accumulators 2 are electrically disconnected from photoelectric converter 1.

In the first sequence, at time t1 at which the irradiation pulse light is turned on, drive pulse signal ODG is driven to low state, and the discharge of the charge from photoelectric converter 1 to overflow drain 9 is stopped. At this time, drive pulse signal TG1 transitions from low state to high state, (Tp/2) earlier than drive pulse signal ODG. The transfer of the signal charge generated as a result of the incidence of light to charge accumulator 2 via first read gate 6a to which TG1 is applied is started.

Next, at time t2, drive pulse signal ODG is driven to high state again, and the signal charge generated in photoelectric converter 1 is discharged to overflow drain 9. As a result of this series of operation, signal A0 illustrated in FIG. 11A is held in charge accumulator 2. Next, at time t3, drive pulse signal ODG is driven to low state, and the discharge of the charge from photoelectric converter 1 to overflow drain 9 is stopped. At this time, drive pulse signal TG2 transitions from low state to high state, (Tp/2) earlier than drive pulse signal ODG. The transfer of the signal charge generated as a result of the incidence of light to charge accumulator 2 via first read gate 6b to which TG2 is applied is started. Next, at time t4, drive pulse signal ODG is driven to high state, and the signal charge generated in photoelectric converter 1 is discharged to overflow drain 9. As a result of this operation, signal A2 illustrated in FIG. 11A is held in charge accumulator 2.

In the second sequence, at time t2, drive pulse signal ODG is driven to low state, and the discharge of the charge from photoelectric converter 1 to overflow drain 9 is stopped. At this time, drive pulse signal TG1 transitions from low state to high state, (Tp/2) earlier than drive pulse signal ODG. The transfer of the signal charge generated as a result of the incidence of light to charge accumulator 2 via first read gate 6a to which TG1 is applied is started. Next, at time t3, drive pulse signal ODG is driven to high state, and the signal charge generated in photoelectric converter 1 is discharged to overflow drain 9. As a result of this operation, signal A1 illustrated in FIG. 11B is held in charge accumulator 2. Next, at time t4, drive pulse signal ODG is driven to low state, and the discharge of the charge from photoelectric converter 1 to overflow drain 9 is stopped. At this time, drive pulse signal TG2 transitions from low state to high state, (Tp/2) earlier than drive pulse signal ODG. The transfer of the signal charge generated as a result of the incidence of light to charge accumulator 2 via first read gate 6b to which TG2 is applied is started. Next, at time t5, drive pulse signal ODG is driven to high state, and the signal charge generated in photoelectric converter 1 is discharged to overflow drain 9. As a result of this operation, signal A3 illustrated in FIG. 11B is held in charge accumulator 2.

As a result of the foregoing operation, signals A0, A1, A2, and A3 are accumulated in first charge accumulator 2a to fourth charge accumulator 2d illustrated in FIG. 10A.

Figure 13A:
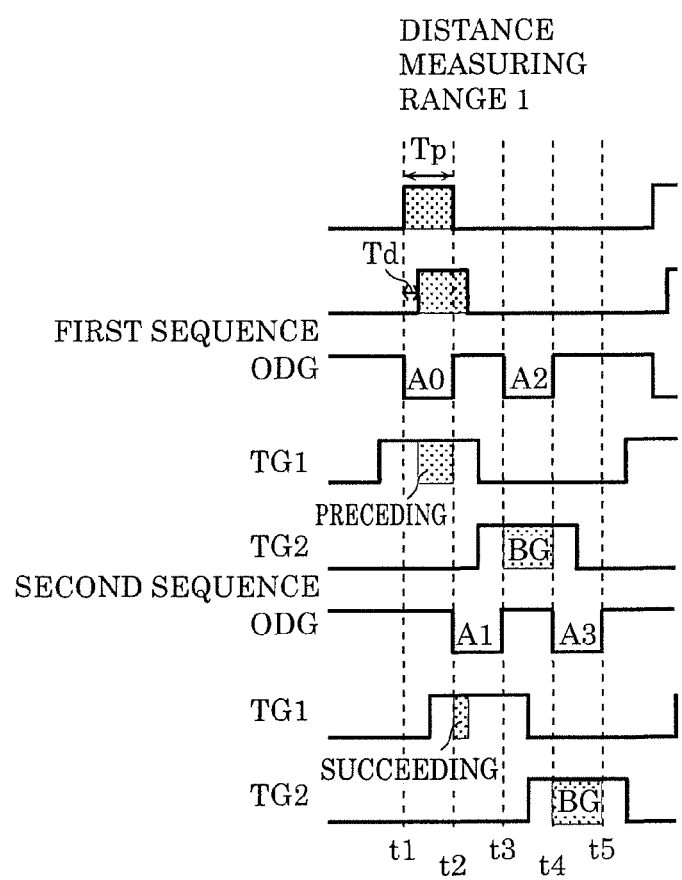
FIG. 13A is a timing chart illustrating the correspondence between a distance-measuring signal output and a distance measuring range of the solid-state imaging device according to Embodiment 1.
Figure 13B:
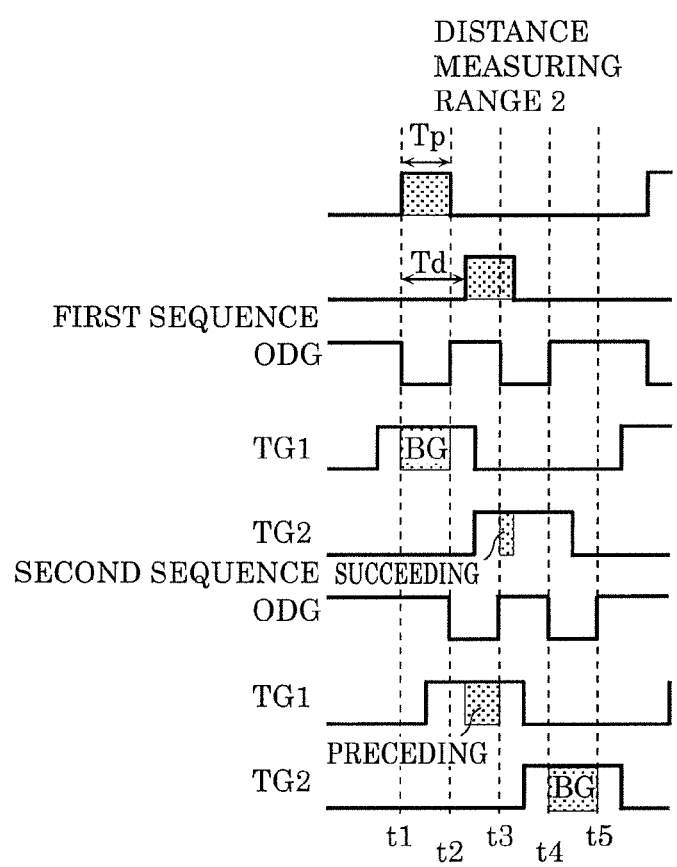
FIG. 13B is a timing chart illustrating the correspondence between a distance-measuring signal output and a distance measuring range of the solid-state imaging device according to Embodiment 1.
Figure 13C:
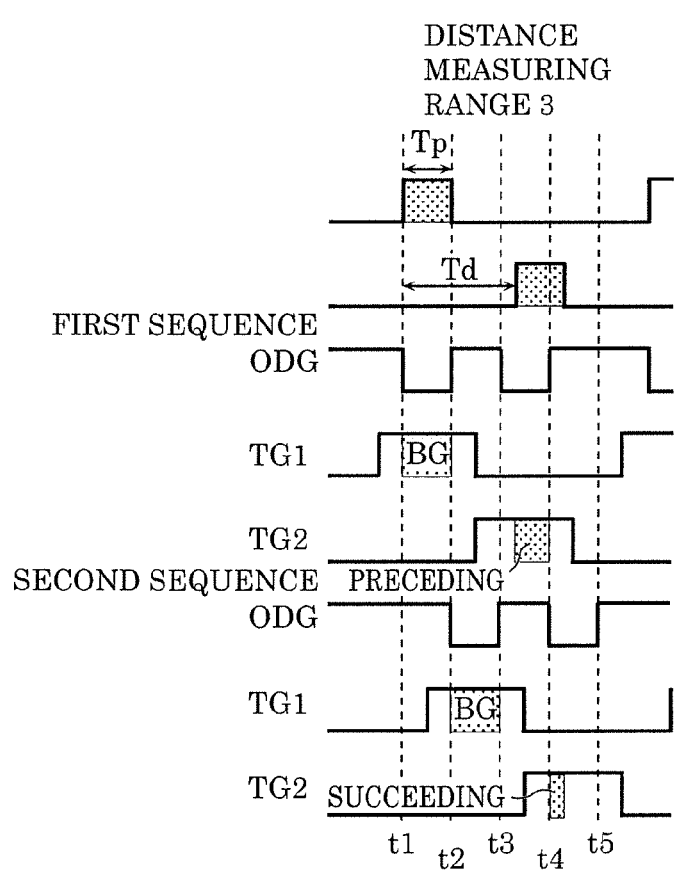
FIG. 13C is a timing chart illustrating the correspondence between a distance-measuring signal output and a distance measuring range of the solid-state imaging device according to Embodiment 1.
Figure 14A:
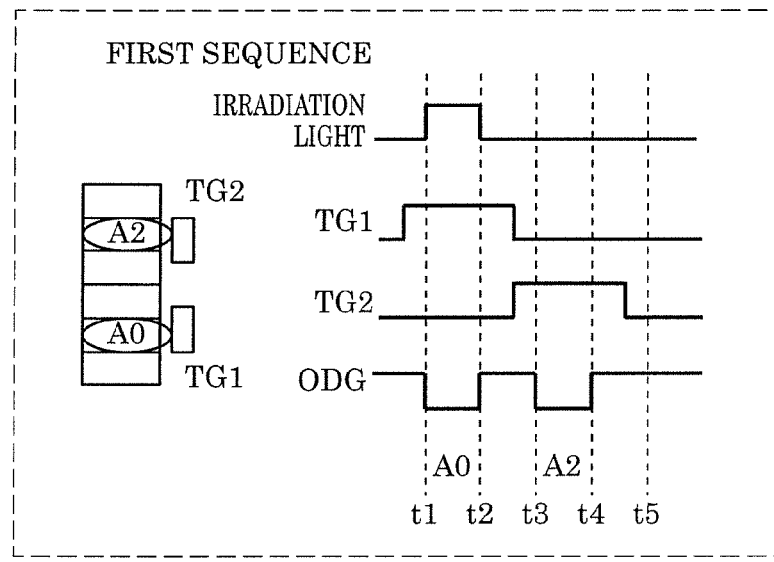
FIG. 14A is a drive timing chart illustrating operation of the solid-state imaging device according to Embodiment 1 before and after signal interchange during exposure.
Figure 14B:
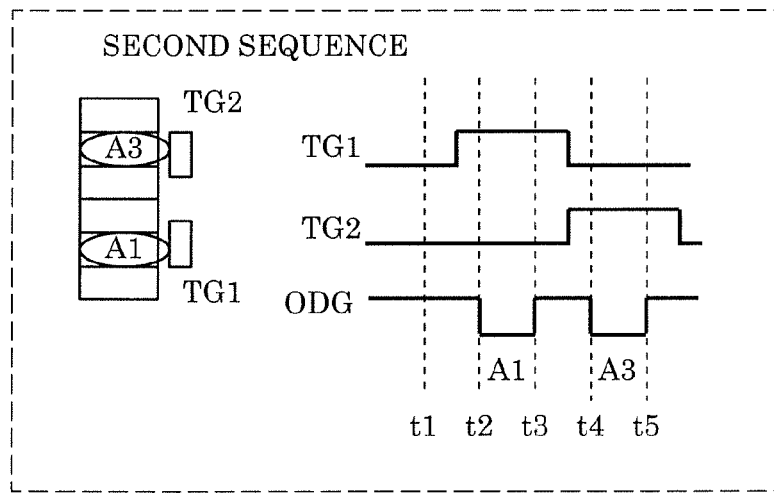
FIG. 14B is a drive timing chart illustrating operation of the solid-state imaging device according to Embodiment 1 before and after signal interchange during exposure.
Figure 14C:
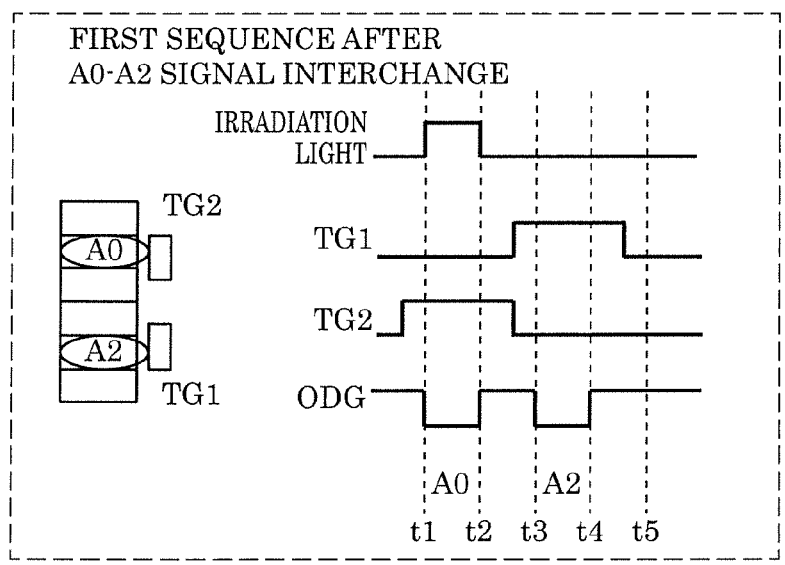
FIG. 14C is a drive timing chart illustrating operation of the solid-state imaging device according to Embodiment 1 before and after signal interchange during exposure.
Figure 14D:
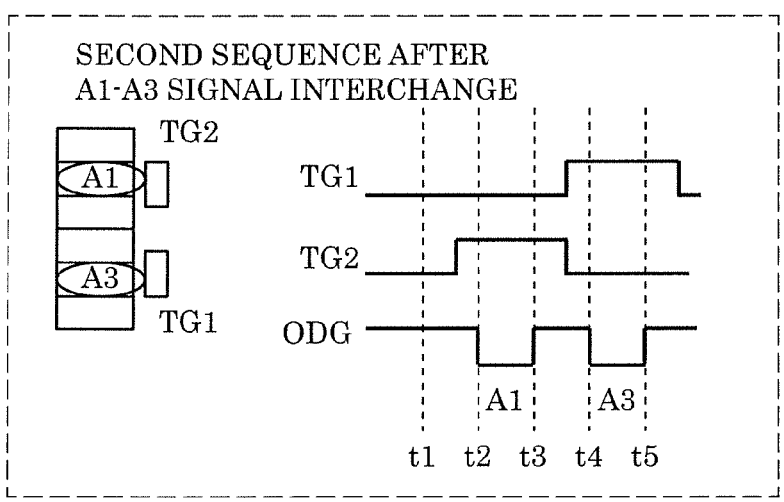
FIG. 14D is a drive timing chart illustrating operation of the solid-state imaging device according to Embodiment 1 before and after signal interchange during exposure.

FIGS. 13A to 13C are each a timing chart illustrating the correspondence between a distance-measuring signal output and a distance measuring range of the solid-state imaging device according to Embodiment 1. FIG. 13A illustrates distance measuring range 1, FIG. 13B illustrates distance measuring range 2, and FIG. 13C illustrates distance measuring range 3, which are classified depending on delay time Td of reflected pulse light. Distance measuring range 1 corresponds to the case where Td is 0 to Tp. Distance measuring range 2 corresponds to the case where Td is Tp to 2Tp. Distance measuring range 3 corresponds to the case where Td is 2Tp to 3Tp. Times t1 to t5 are at the same time interval, which is equal to irradiation pulse width Tp. FIG. 13D is a correspondence table indicating the correspondence relationship between each distance measuring range and signals A0, A1, A2, and A3 accumulated in charge accumulators 2.

The case of distance measuring range 1 in FIG. 13A will be described below.

Preceding component A0 of the reflected pulse light including background light is read by high voltage of TG1 in the first sequence, whereas background light component BG is read by high voltage of TG2. On the other hand, succeeding component A1 of the reflected pulse light including background light is read by high voltage of TG1 in the second sequence, whereas background light component BG is read by high voltage of TG2.

Delay amount Td=Tp×((A1−BG)/(A0+A1−2×BG)) of the reflected pulse light is calculated based on these signals, and the distance to the object is calculated.

In distance measuring range 1, A0>A2, and A1>A3, and distance d is calculated according to the following Formula 1. In this case, for background light exposure amount BG, it is desirable to use A3 for the numerator part and, for the denominator part, A2 for A0 and A3 for A1. This is intended to match dark current and parasitic sensitivity between A0 and A2 and between A1 and A3 in this embodiment (described later).

[Math. 1]

$$d = \frac{c \cdot T_0}{2} \times \left( \frac{A1 - BG}{A0 - BG + A1 - BG} \right). \quad \text{(Formula 1)}$$

Since the delay amount of the reflected pulse light is different, at which of A0 to A4 each of the signals including distance information and the signal including only background light is located is as illustrated in the table in FIG. 13D. In all cases, the distance to the object can be calculated by selecting an appropriate signal, and the distance measuring range can be extended to 3c×T0/2, i.e. three times that of c×T0/2 in the conventional example, without loss of distance accuracy.

In distance measuring range 2, A2>A0, and A1>A3, and distance d is calculated according to the following Formula 2. In this case, for background light exposure amount BG, it is desirable to use A0 for the numerator part and, for the denominator part, A3 for A1 and A0 for A2. The reason is as described with regard to distance measuring range 1.

[Math. 2]

$$d = \frac{c \cdot T_0}{2} \times \left( \frac{A2 - BG}{A1 - BG + A2 - BG} \right) + \frac{c \cdot T_0}{2}. \quad \text{(Formula 2)}$$

In distance measuring range 3, A2>A0, and A3>A1, and distance d is calculated according to the following Formula 3. In this case, for background light exposure amount BG, it is desirable to use A1 for the numerator part and, for the denominator part, A0 for A2 and A1 for A3. The reason is as described with regard to distance measuring range 1.

[Math. 3]

$$d = \frac{c \cdot T_0}{2} \times \left( \frac{A3 - BG}{A2 - BG + A3 - BG} \right) + 2 \times \frac{c \cdot T_0}{2}. \quad \text{(Formula 3)}$$

Signal interchange operation will be described below, with reference to FIGS. 14A to 14D, 15, 16A, and 16B.

FIGS. 14A to 14D are each a drive timing chart illustrating operation of the solid-state imaging device according to Embodiment 1 before and after signal interchange during exposure. The drawings also illustrate the positional relationships between the accumulation locations of A0, A1, A2, and A3 in the pixel before and after signal interchange and read gates 6 to which TG1 and TG2 are applied.

FIG. 15 is a schematic plan diagram illustrating signal interchange operation of the solid-state imaging device according to Embodiment 1.

Figure 16A:
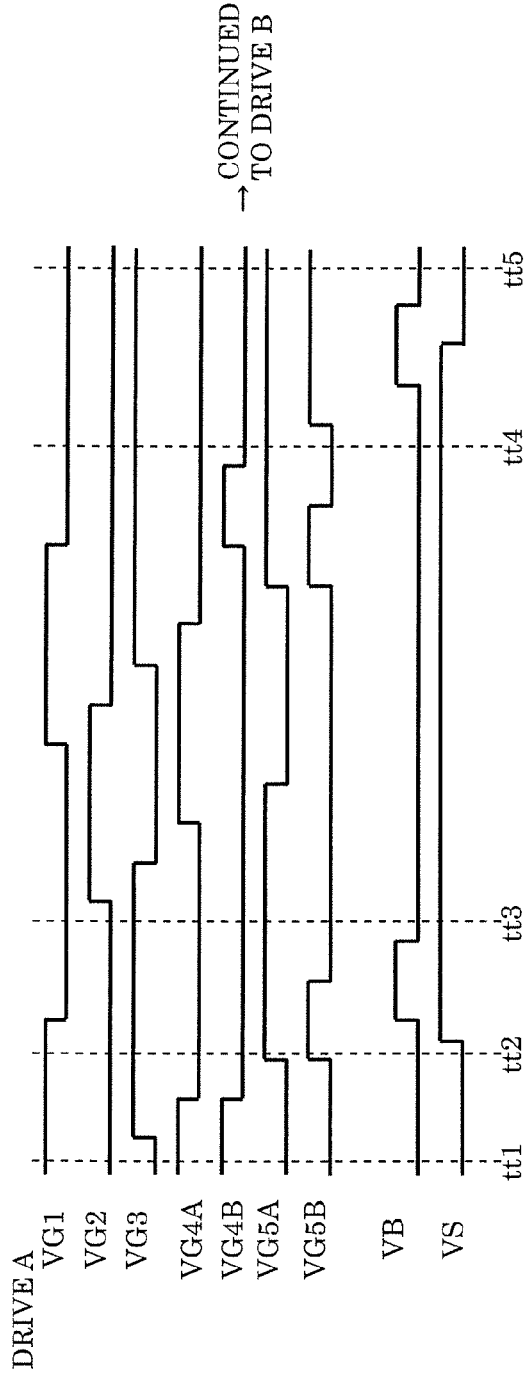
FIG. 16A is a timing chart illustrating signal interchange operation of the solid-state imaging device according to Embodiment 1.
Figure 16B:
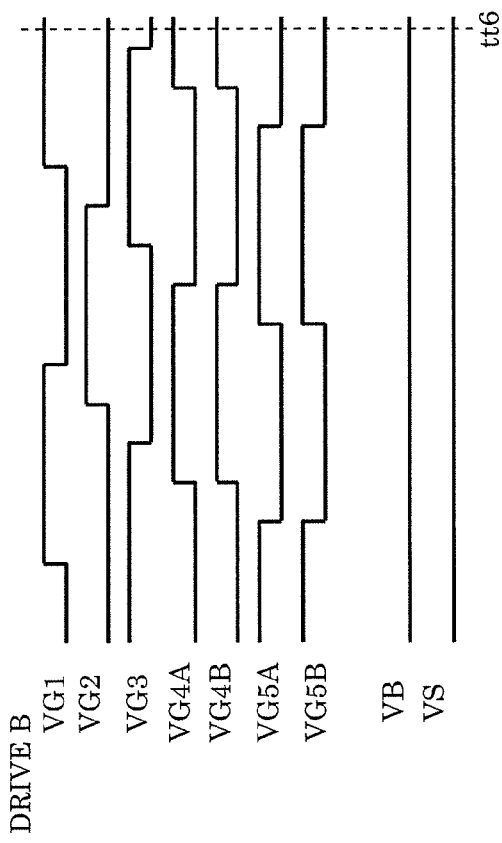
FIG. 16B is a timing chart illustrating signal interchange operation of the solid-state imaging device according to Embodiment 1.

FIGS. 16A and 16B are each a timing chart illustrating signal interchange operation of the solid-state imaging device according to Embodiment 1.

FIGS. 15, 16A, and 16B illustrate signal interchange operation of signals A0 and A2 and signal interchange operation of signals A0' and A2', for simplicity.

In FIGS. 15, 16A, and 16B, drive A is operation from the initial state to when signals A0 and A2 are interchanged, and drive B is operation from when the interchange ends to when each signal returns to the initial exposure position. Drive B is typical 5-phase drive.

In FIGS. 10A and 15, the solid-state imaging device according to Embodiment 1 includes, as transfer electrode 5d to which VG4 is applied, two types of transfer electrodes 5d to which VG4A and VG4B are applied (transfer electrodes 5dA and 5dB in this example), to control drive in interchange operation. The same applies to transfer electrode 5e to which VG5 is applied. The solid-state imaging device according to Embodiment 1 includes two types of transfer electrodes 5e to which VG5A and VG5B are applied (transfer electrodes 5eA and 5eB in this example). VG5B is applied to transfer electrode 5eB adjacent to transfer control gate 12, and VG4B is applied to transfer electrode 5dB located above transfer electrode 5eB to which VG5B is applied.

In FIG. 15, drive pulses VG1, VG2, VG3, VG4A, VG4B, VG5A, and VG5B are applied to respective transfer electrodes 5, to transfer a signal charge to a desired location. Four signals A0, A1, A2, and A3 are to be considered here. Signals read from lowest read gates 6a and 6b in FIG. 15 are denoted by A0, A1, A2, and A3, and signals read from read gates 6a and 6b two pixels above lowest read gates 6a and 6b are denoted by A0', A1', A2', and A3'. Signals of other adjacent pixels are omitted, for simplicity. Operation of drive A will be described below. tt1 corresponds to a state in which the exposure illustrated in FIGS. 14A and 14B ends. Eight signals are accumulated under transfer electrodes 5 to which VG1, VG4A, and VG4B which are high voltage are applied, and signal A0 is located beside read gate 6a to which TG1 is applied and signal A2 is located beside read gate 6b to which TG2 is applied. After this, the signal charges are transferred by 5-phase drive in the upward direction in FIG. 15. At tt2, VG3, VG5A, and VG5B are driven to high voltage, and the signal charges are accumulated under transfer electrodes 5 to which VG3, VG5A, and VG5B are applied. Next, as illustrated in FIG. 16A, high voltage is applied to charge holding gate 11 to which VS is applied and then high voltage is applied to transfer control gate 12 to which VB is applied, to form a charge transfer path between charge accumulator 2 of transfer electrode 5 to which high voltage of VG5B is applied and charge holder 10. After this, low voltage is applied sequentially to transfer electrode 5 and transfer control gate 12 to which VG5B and VB are applied, to transfer signal A2 to under charge holding gate 11 (tt3 in FIGS. 15 and 16A).

Next, signal A0 located below signal A2 under charge holding gate 11 at tt3 is transferred upward by 5-phase drive over charge holding gate 11, and accumulated under transfer electrode 5 to which VG3 is applied (tt4).

Subsequently, VG5B and VB are driven to high voltage again, to form a transfer path between charge holder 10 and charge accumulator 2 of transfer electrode 5 to which VG5B is applied. After this, low voltage is applied in the order of VS and VB, to transfer signal A2 to under transfer electrode 5 to which high voltage of VG5B is applied (tt5).

Next, transfer is performed by 5-phase drive indicated by drive B in the downward direction, to create a state in which A0 and A2 are interchanged in vertical position (tt6).

After this interchange operation, signal A0 is located beside read gate 6b to which TG2 is applied, and signal A2 is located beside read gate 6a to which TG1 is applied, as illustrated in FIG. 15. Accordingly, the pulse timings of pulses applied to TG1 and TG2 can be interchanged to start exposure again, as illustrated in the first sequence after A0-A2 signal interchange in FIG. 14C.

Figure 17:
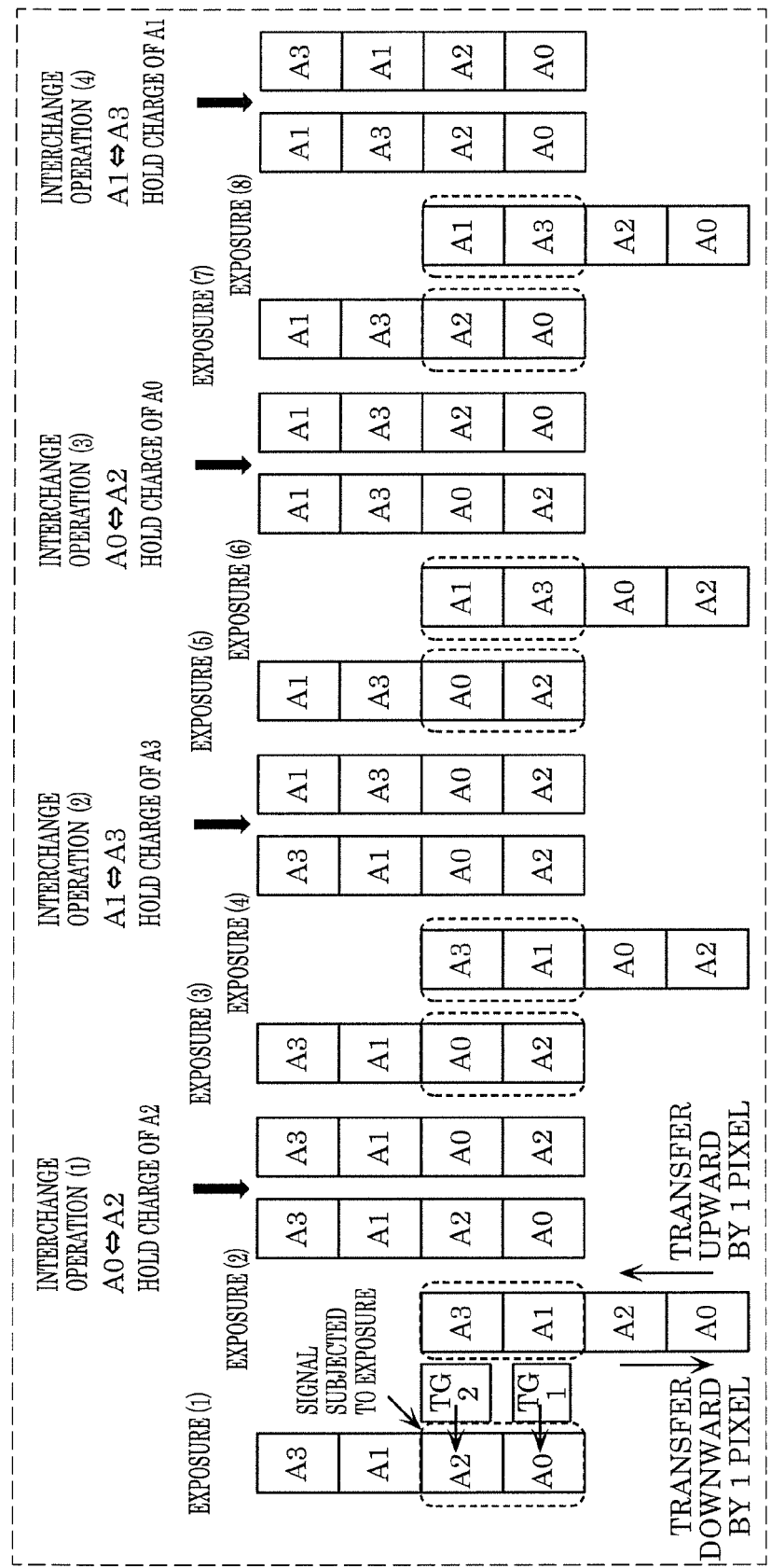
FIG. 17 is a plan diagram illustrating arrangement of each signal and operation of the solid-state imaging device according to Embodiment 1 during exposure.

FIG. 17 is a plan diagram illustrating arrangement of each signal and operation of the solid-state imaging device according to Embodiment 1 during exposure. For simplicity, transfer electrodes 5 are omitted, and only first charge accumulator 2a, second charge accumulator 2b, third charge accumulator 2c, fourth charge accumulator 2d, and signal charges accumulated in respective charge accumulator 2 are illustrated.

In this embodiment, to evenly distribute, among signals, differences in read characteristics, dark current differences and parasitic sensitivity differences of charge accumulators 2, and dark current and parasitic sensitivity of charge holder 10 mixed in each signal in interchange operation, an exposure period is made up of exposures (1) to (8) and interchange operations (1) to (4), as illustrated in FIG. 17. Exposures (1) to (8) have the same exposure time. For interchange operation of two signals, one of the signals needs to be transferred to charge holder 10. FIG. 17 also illustrates which signal is transferred to charge holder 10 in interchange operations (1) to (4).

As illustrated in FIG. 12, in the first sequence, a read pulse is applied to read gate 6a to which TG1 is applied to accumulate A0, and a read pulse is applied to read gate 6b to which TG2 is applied to accumulate signal A2. A0 read by TG1 is denoted by A0(TG1), and A2 read by TG2 is denoted by A2(TG2), as in Basic Mode 2. Subsequently, the charges are transferred downward by one pixel, a read pulse is applied to TG1 to accumulate A1(TG1), and a read pulse is applied to TG2 to accumulate A3(TG2). Subsequently, the charges are transferred upward by one pixel, to return to the original exposure position. As illustrated in FIG. 17, transfer by one pixel is performed above and below the pixel in which the signal subjected to exposure is present. Accordingly, while there are four signals, six charge accumulators 2 are to be taken into consideration. The dark currents of charge accumulators 2 beside read gates 6b and 6a to which TG2 and TG1 are applied are denoted respectively by DS1 and DS2, and their leakage and parasitic sensitivities are denoted respectively by Sm1 and Sm2. The dark currents of charge accumulators 2 in the pixel located above the pixel subjected to exposure are denoted respectively by DSU1 and DSU2 from above, and their parasitic sensitivities are denoted respectively by SmU1 and SmU2. The dark currents of charge accumulators 2 in the pixel located below the pixel subjected to exposure are denoted respectively by DSD1 and DSD2, and their parasitic sensitivities are denoted respectively by SmD1 and SmD2. The dark current of charge holder 10 is denoted by DX, and the parasitic sensitivity of charge holder 10 is denoted by SmX, as in Basic Mode 2.

In first exposure (1), signals A0, A1, A2, and A3 are expressed by the following formulas.

$A0=A0(TG1)+DS2+Sm2$ $A2=A2(TG2)+DS1+Sm1$ $A1=DSU2+SmU2$ $A3=DSU1+SmU1.$

Likewise, in exposure (2), $A0=DSD2+SmD2$ $A2=DSD1+SmD1$ $A1=A1(TG1)+DS2+Sm2$ $A3=A3(TG2)+DS1+Sm1.$ In exposure (3) after interchange operation (1), dark current DSX and parasitic sensitivity SmX of charge holder 10 are added to A2 because signal A2 is transferred to charge holder 10 in interchange operation (1). Accordingly, $A0=A0(TG2)+DS1+Sm1$ $A2=A2(TG1)+DS2+Sm2+DSX+SmX$ $A1=DSU2+SmU2$ $A3=DSU1+SmU1.$ In exposure (4), $A0=DSD1+SmD1$ $A2=DSD2+SmD2$ $A1=A1(TG1)+DS2+Sm2$ $A3=A3(TG2)+DS1+Sm1.$ In exposure (5) after interchange operation (2), dark current DSX and parasitic sensitivity SmX of charge holder 10 are added to A3 because signal A3 is transferred to charge holder 10 in interchange operation (2). Accordingly, $$A0=A0(TG2)+DS1+Sm1$$

$$A2=A2(TG1)+DS2+Sm2$$

$$A1=DSU1+SmU1$$

$$A3=DSU2+SmU2+DSX+SmX.$$

In exposure (6), $$A0=DSD1+SmD1$$

$$A2=DSD2+SmD2$$

$$A1=A1(TG2)+DS1+Sm1$$

$$A3=A3(TG1)+DS2+Sm2.$$

In exposure (7) after interchange operation (3), dark current DSX and parasitic sensitivity SmX of charge holder 10 are added to A0 because signal A0 is transferred to charge holder 10 in interchange operation (3). Accordingly, $$A0=A0(TG1)+DS2+Sm2+DSX+SmX$$

$$A2=A2(TG2)+DS1+Sm1$$

$$A1=DSU1+SmU1$$

$$A3=DSD2+SmU2.$$

In exposure (8), $$A0=DSD2+SmD2$$

$$A2=DSD1+SmD1$$

$$A1=A1(TG2)+DS1+Sm1$$

$$A3=A3(TG1)+DS2+Sm2.$$

After interchange operation (4), dark current DSX and parasitic sensitivity SmX of charge holder 10 are added to A1 because signal A1 is transferred to charge holder 10. Since there is no exposure subsequently, other parasitic sensitivity and dark current are substantially negligible, and are taken to be 0. Accordingly, $$A0=0$$

$$A2=0$$

$$A1=DSX+SmX$$

$$A3=0.$$

Adding the foregoing for each of A0, A1, A2, and A3 yields $$A0=2\times A0(TG1)+2\times A0(TG2)+2\times DS1+2\times Sm1+2\times DS2+2\times Sm2+2\times DSD1+2\times SmD1+2\times DSD2+2\times SmD2+DSX+SmX$$

$$A2=2\times A2(TG1)+2\times A2(TG2)+2\times DS1+2\times Sm1+2\times DS2+2\times Sm2+2\times DSD1+2\times SmD1+2\times DSD2+2\times SmD2+DSX+SmX$$

$$A1=2\times A1(TG1)+2\times A1(TG2)+2\times DS1+2\times Sm1+2\times DS2+2\times Sm2+2\times DSU1+2\times SmU1+2\times DSU2+2\times SmU2+DSX+SmX$$

$$A3=2\times A3(TG1)+2\times A3(TG2)+2\times DS1+2\times Sm1+2\times DS2+2\times Sm2+2\times DSU1+2\times SmU1+2\times DSU2+2\times SmU2+DSX+SmX.$$

Thus, by reading, for each of components A0 and A2, A0 or A2 by two different read gates 6 and adding them, differences in read characteristics are canceled out. Moreover, dark current and parasitic sensitivity are evenly included in each of A0 and A2. The same applies to A1 and A3. In the exposure method according to this embodiment, one of A0 and A2 reads only the background light component not including distance information from photoelectric converter 1, as illustrated in FIG. 13D. The same applies to A1 and A3. Therefore, by calculating A0−A2 (or A2−A0) and A1−A3 (or A3−A1) in each range, the background light component can be subtracted, and dark current/parasitic sensitivity differences due to different charge accumulators 2 can be canceled out. This resolves errors after subtraction, and reduces distance measuring error.

In this embodiment, since respective signals are accumulated in charge accumulators 2 during a signal read period, dark current differences and parasitic sensitivity differences occur in this period, too, as described in Basic Mode 2. Therefore, interchange operation of signal charges between charge accumulators 2 needs to be performed in the signal read period, too.

Figure 18:
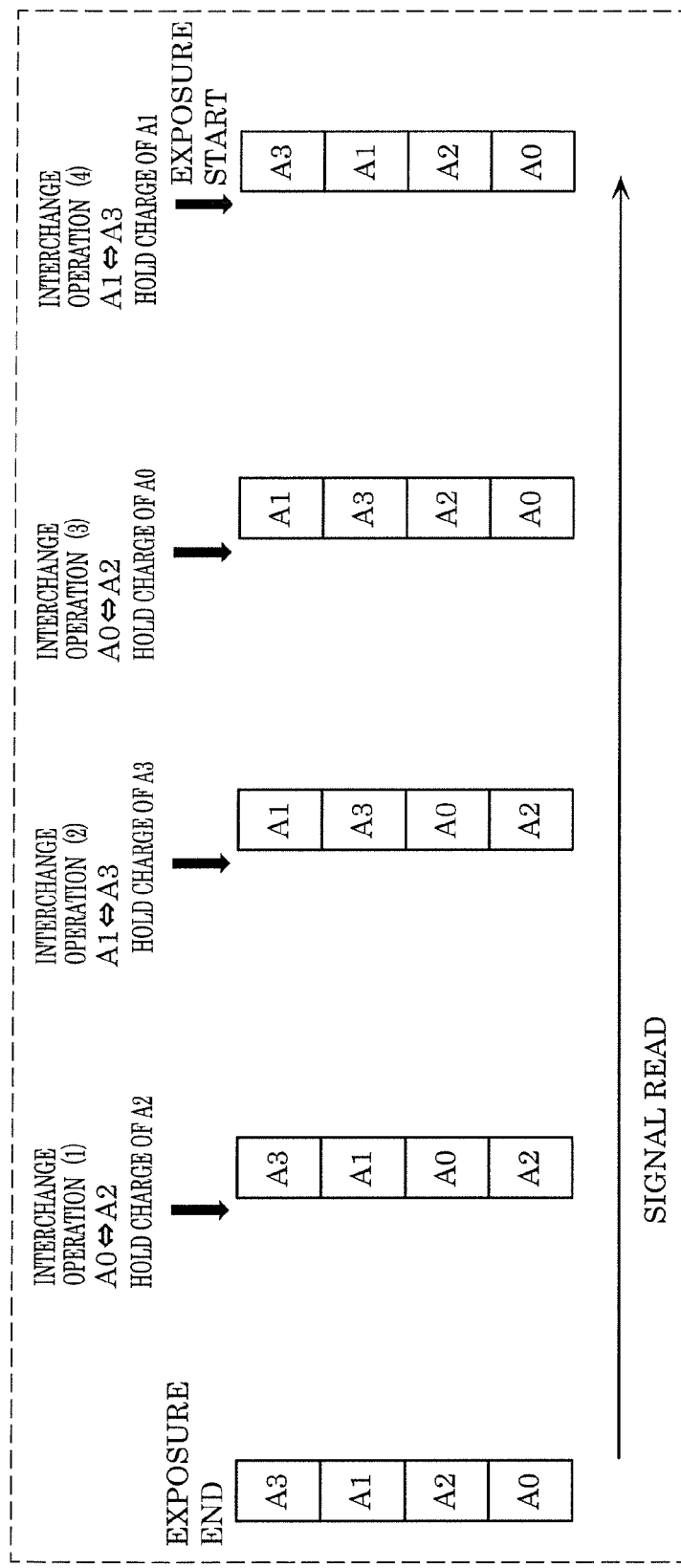
FIG. 18 is a plan diagram illustrating arrangement of each signal and operation of the solid-state imaging device according to Embodiment 1 during signal read.

FIG. 18 is a plan diagram illustrating arrangement of each signal and operation of the solid-state imaging device according to Embodiment 1 during signal read. For simplicity, transfer electrodes 5 are omitted, and only first charge accumulator 2a, second charge accumulator 2b, third charge accumulator 2c, fourth charge accumulator 2d, and signals accumulated in respective charge accumulator 2 are illustrated, as in FIG. 17.

By performing interchange operations (1) to (4) in the signal read period, too, dark current differences and parasitic sensitivity differences which occur in different charge accumulators 2 during this period can also be made equal between A0 and A2 and between A1 and A3. It is desirable to perform interchange operations (1) to (4) at least four times in the signal read period.

Although not illustrated in FIG. 10A, charge holder reset gate 18 and charge holder reset drain 19 may be provided adjacent to charge holder 10, as in Basic Mode 3.

Although the solid-state imaging device according to Embodiment 1 is described as having a structure in which a plurality of read gates 6 read signal charges from photoelectric converter 1 as an example, the solid-state imaging device is not limited to having a plurality of read gates 6. For example, the solid-state imaging device according to Embodiment 1 may have a structure in which one read gate reads a signal charge from photoelectric converter 1.

As described in detail above, according to this embodiment, the distance measuring range is wide and the influence of parasitic sensitivity and dark current of charge holder 10 can be reduced, as compared with Basic Mode 2. A distance-measuring solid-state imaging device having excellent distance measuring accuracy can thus be provided.

Embodiment 2

A solid-state imaging device according to Embodiment 2 of the present disclosure will be described below with reference to drawings, mainly focusing on differences from the foregoing basic modes and embodiment.

Figure 19:
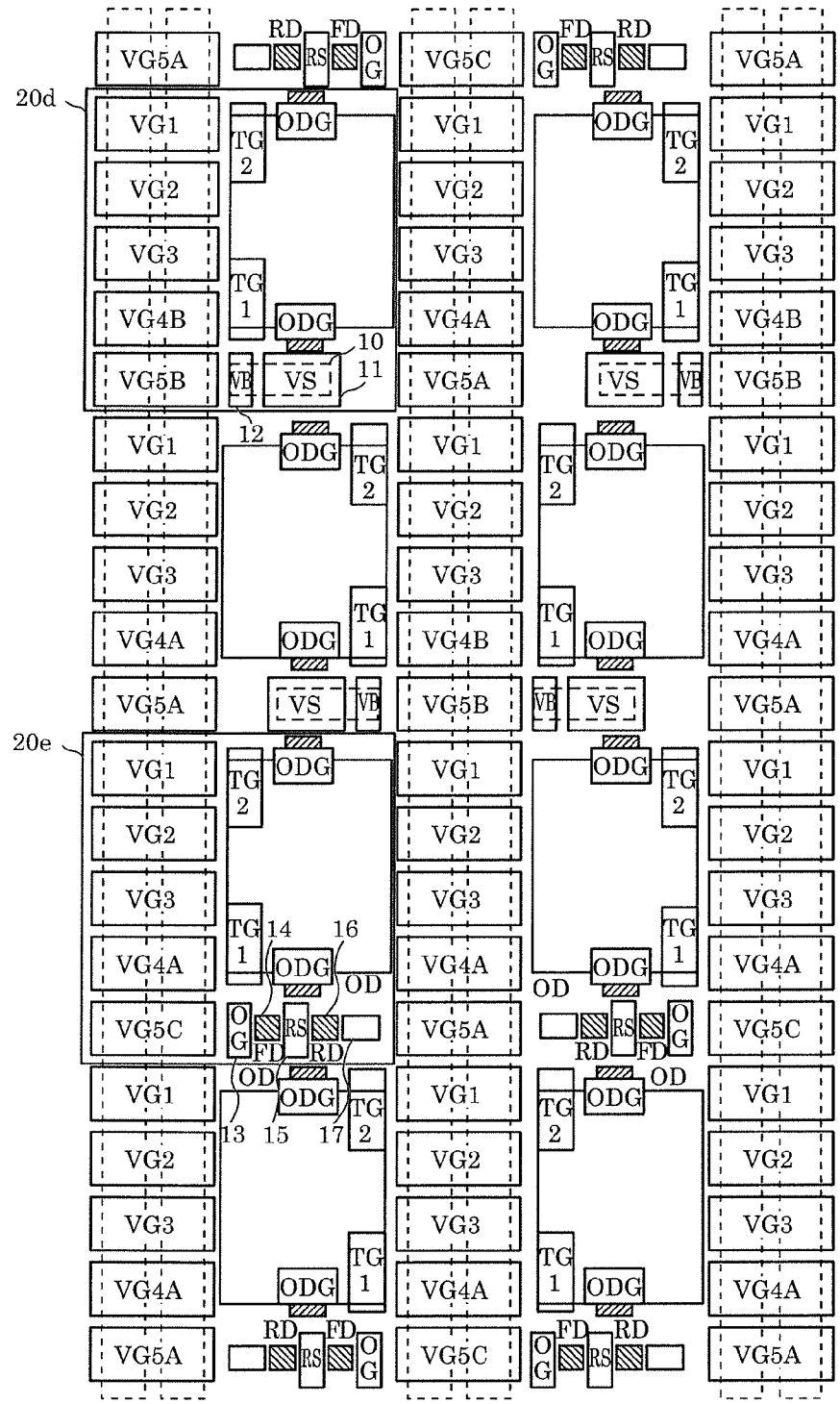
FIG. 19 is a schematic plan diagram illustrating a layout structure of a pixel included in a solid-state imaging device according to Embodiment 2.

FIG. 19 is a schematic plan diagram illustrating a layout structure of pixels 20d and 20e included in the solid-state imaging device according to Embodiment 2 of the present disclosure.

The solid-state imaging device according to this embodiment differs from Embodiment 1 in that output control gate 13, floating diffusion layer 14, reset gate 15, reset drain 16, read circuit 17, and charge holder 10 are shared by four pixels in the vertical direction. The structural elements are the same as above, and accordingly their description is omitted as already described.

This embodiment has the following advantage over Embodiment 1: Since the output portion (output control gate 13, floating diffusion layer 14, reset gate 15, reset drain 16, and read circuit 17) and charge holder 10 are shared by four pixels in the vertical direction, any one of charge holder 10 and the output portion is located in a separate region between photoelectric converters 1 adjacent in the column direction of the plurality of pixels 20 arranged in a matrix, i.e. the up-down direction in FIG. 19. This can increase the area of charge holder 10, and implement the layout of charge holder 10 relatively easily. Hence, the amount of charge handled by charge holder 10 can be increased. Moreover, the parasitic sensitivity and dark current of charge holder 10 mix in a state of being divided among eight signals, so that the influence of the parasitic sensitivity and dark current of charge holder 10 can be reduced (described later).

Thus, the solid-state imaging device according to Embodiment 2 includes two types of pixels 20: first pixel 20d including charge holder 10; and second pixel 20e including the output portion that includes floating diffusion layer 14 and read circuit 17. First pixel 20e shares floating diffusion layer 14 with at least one of second pixels 20d arranged with first pixel 20d in the column direction in the matrix arrangement of plurality of pixels 20, and second pixel 20d shares charge holder 10 with at least one of first pixels 20e arranged with second pixel 20d in the column direction.

Operation of the solid-state imaging device according to Embodiment 2 will be described below.

Operation during exposure is the same as in Embodiment 1. As illustrated in FIGS. 11 and 12, the first sequence is repeatedly performed a plurality of times to obtain signals A0 and A2, then signal charges are transferred by one pixel, and signals A1 and A3 are obtained by the second sequence.

Figure 20:
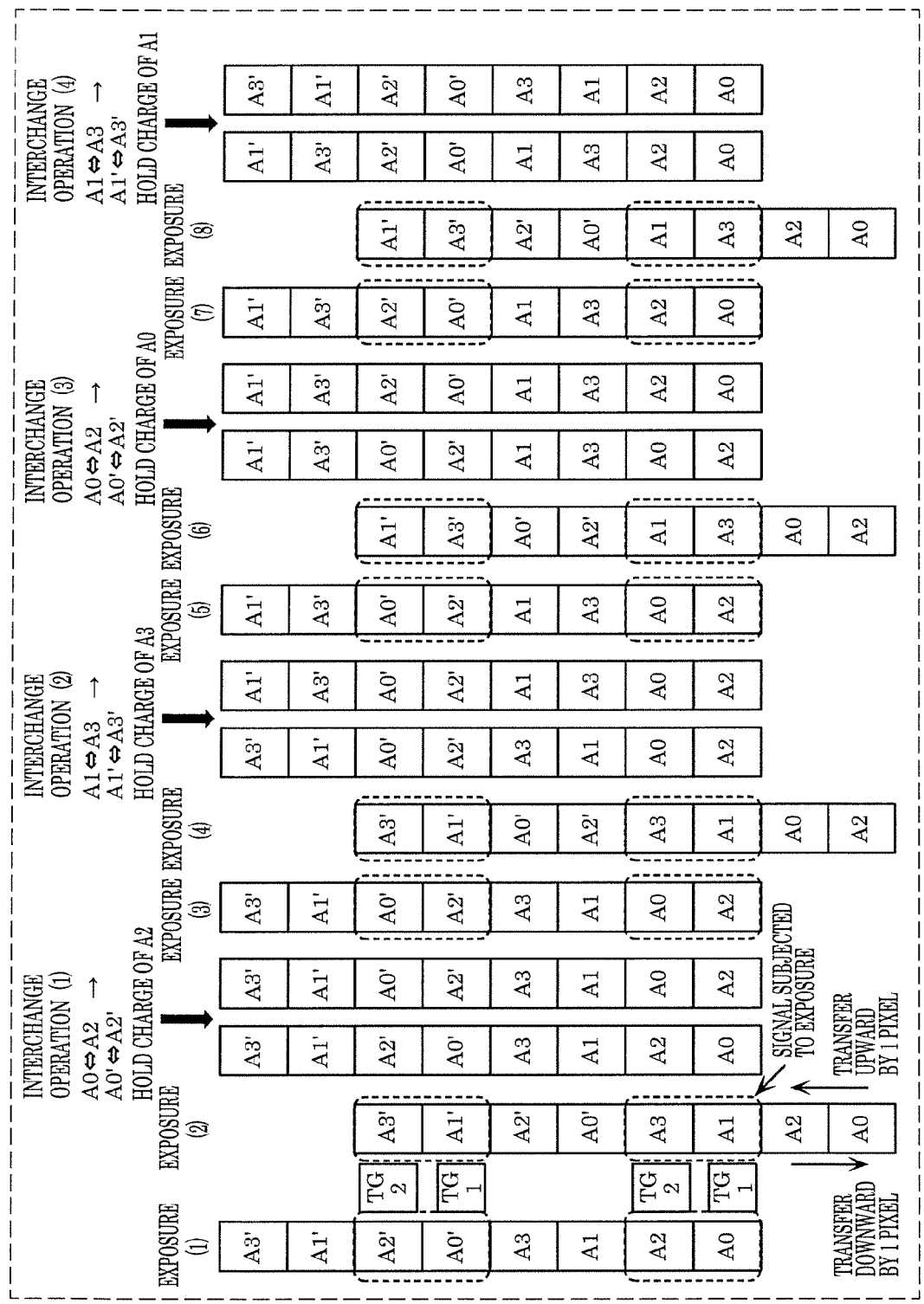
FIG. 20 is a plan diagram illustrating arrangement of each signal and operation of the solid-state imaging device according to Embodiment 2 during exposure.
Figure 21:
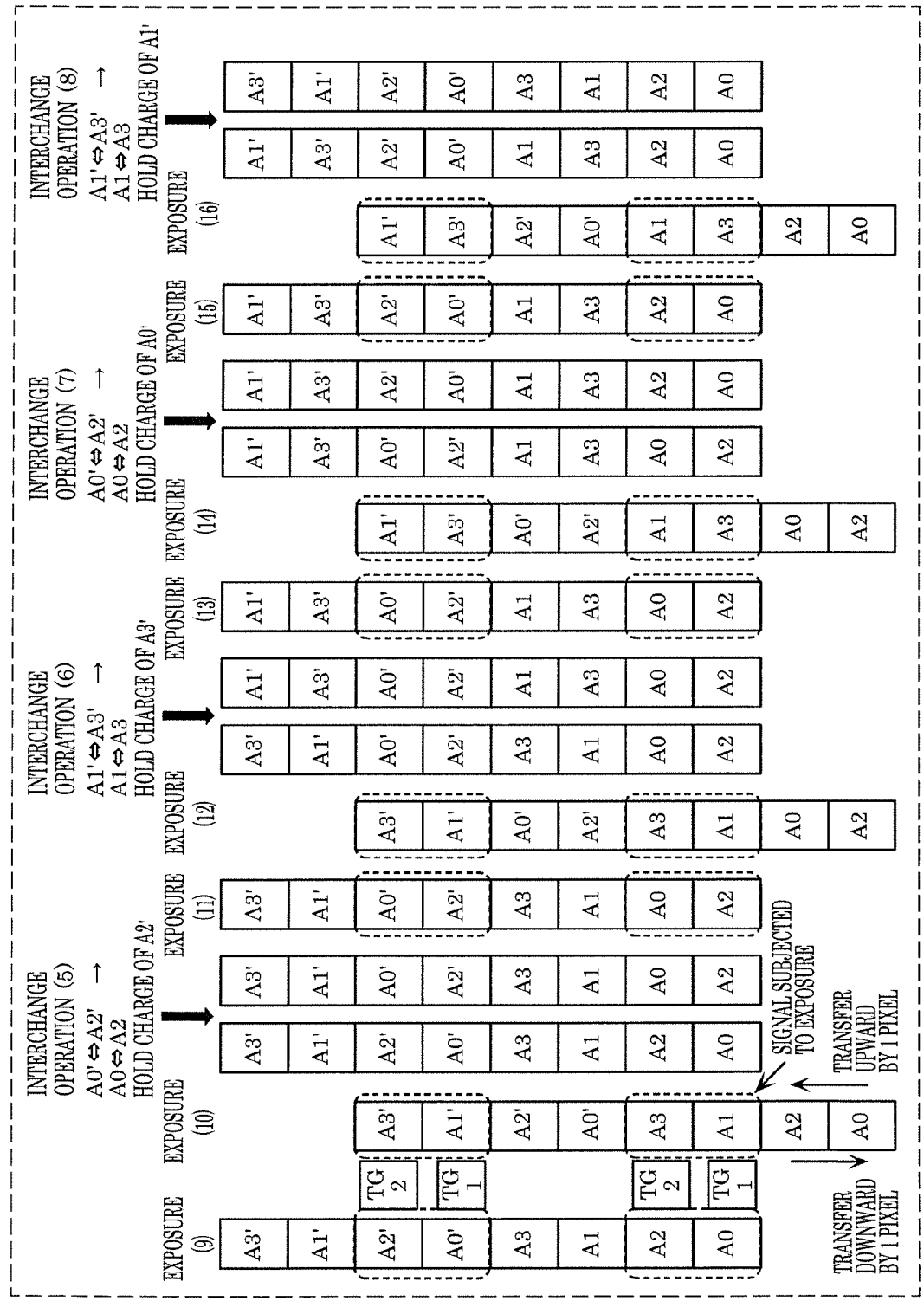
FIG. 21 is a plan diagram illustrating arrangement of each signal and operation of the solid-state imaging device according to Embodiment 2 during exposure.

FIGS. 20 and 21 are each a plan diagram illustrating arrangement of each signal and operation of the solid-state imaging device according to Embodiment 2 during exposure. For simplicity, transfer electrodes 5 are omitted, and only first charge accumulator 2a, second charge accumulator 2b, third charge accumulator 2c, fourth charge accumulator 2d, and signals accumulated in respective charge accumulator 2 are illustrated.

In this embodiment, to evenly distribute, among signals, differences in read characteristics, dark current differences and parasitic sensitivity differences of charge accumulators 2, and dark current and parasitic sensitivity of charge holder 10 mixed in each signal in interchange operation, an exposure period is made up of exposures (1) to (16) and interchange operations (1) to (8), as illustrated in FIGS. 20 and 21. Exposures (1) to (16) have the same exposure time. For interchange operation of two signals, one of the signals needs to be transferred to charge holder 10. FIG. 17 also illustrates which signal is transferred to charge holder 10 in interchange operations (1) to (8).

Detailed operation will be described below, with reference to FIGS. 20 and 21.

In this embodiment, charge holder 10 and the output portion are shared by four pixels in the vertical direction, and accordingly eight signals need to be considered. As illustrated in FIGS. 20 and 21, signals obtained by exposure (1) upward from lower pixel 20 having read gate 6 are denoted by A0, A2, A1, A3, A0', A2', A1', and A3'. In this embodiment, four pixels share one charge holder 10. Therefore, in interchange operation during exposure, for example in interchange operation (1) in FIG. 20, interchange operation of signals A0 and A2 needs to be followed by interchange operation of signals A0' and A2' of another pixel, unlike in Embodiment 1. This is taken to be 1 set. Because each signal needs to be transferred to charge holder 10 first in interchange operation the same number of times, it is desirable to perform interchange operation for at least eight sets (1) to (8) as illustrated in FIGS. 20 and 21. Although not described in detail, in A0 and A2, A1 and A3, A0' and A2', and A1' and A3', the signals evenly include components read by two different read gates 6 and add them, so that differences in read characteristics are canceled out, as in Embodiment 1. Moreover, dark current and parasitic sensitivity are evenly included between A0 and A2, between A1 and A3, between A0' and A2', and between A1' and A3'. In the exposure method according to this embodiment, one of A0 and A2 reads only the background light component not including distance information from photoelectric converter 1, as illustrated in FIG. 13D. The same applies to A1 and A3, A0' and A2', and A1 and A3'. Therefore, by calculating A0−A2 (or A2−A0), A1−A3 (or A3−A1), A0'−A2' (or A2'−A0'), and A1'−A3' (or A3'−A1) in each distance measuring range, the background light component can be subtracted, and dark current/parasitic sensitivity differences due to different charge accumulators 2 can be canceled out. This resolves errors after subtraction, and reduces distance measuring error.

Figure 22A:
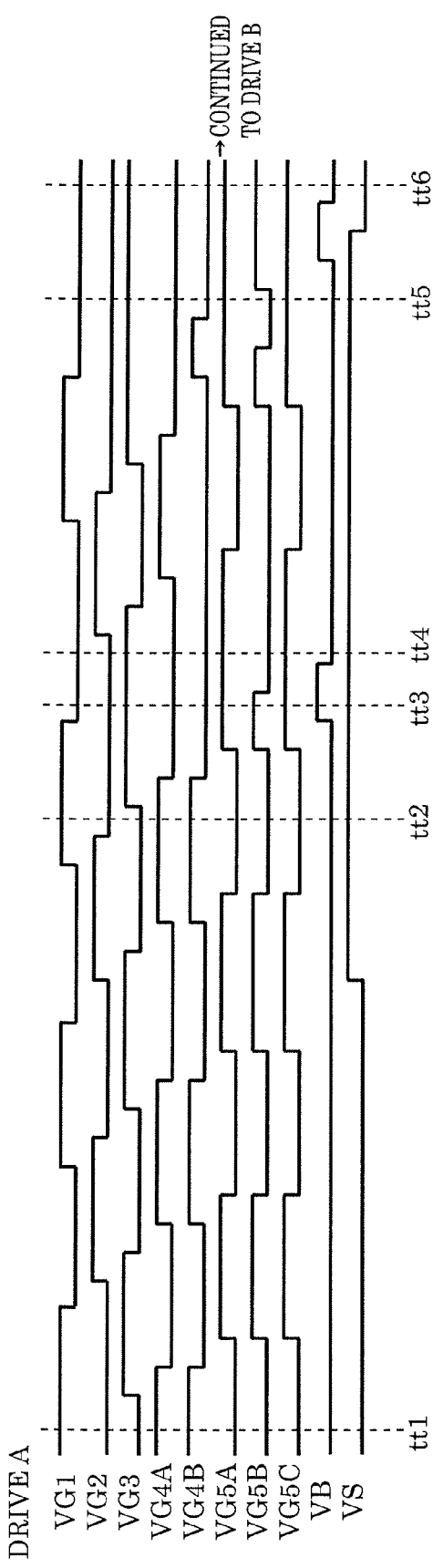
FIG. 22A is a timing chart illustrating interchange operation of signals A0 and A2 of the solid-state imaging device according to Embodiment 2 during exposure.
Figure 22B:
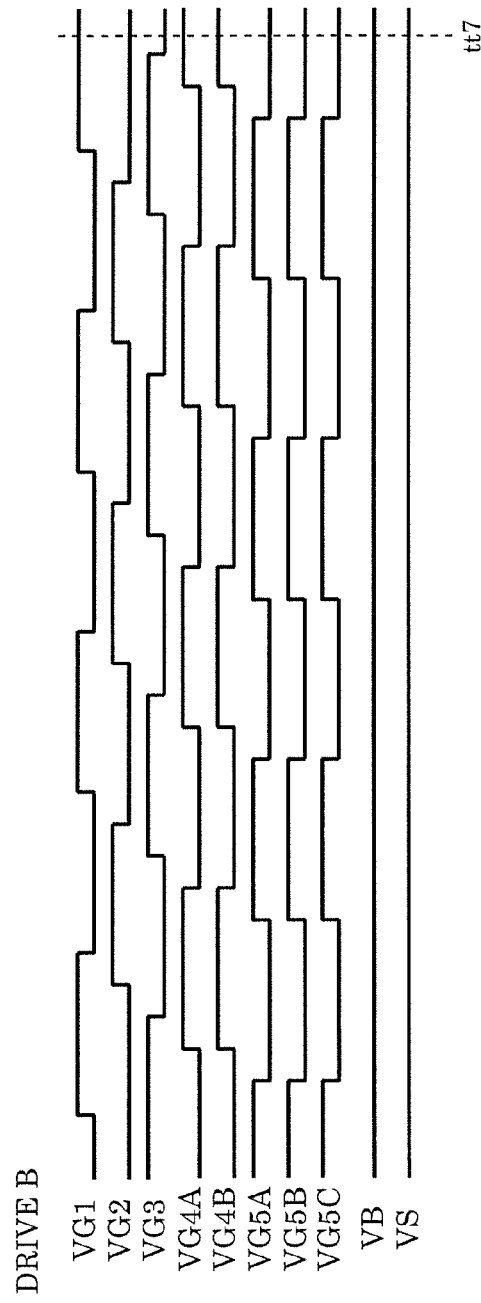
FIG. 22B is a timing chart illustrating interchange operation of signals A0 and A2 of the solid-state imaging device according to Embodiment 2 during exposure.

FIGS. 22A and 22B are each a timing chart illustrating interchange operation of signals A0 and A2 in solid-state imaging device according to Embodiment 2 during exposure.

Figure 23:
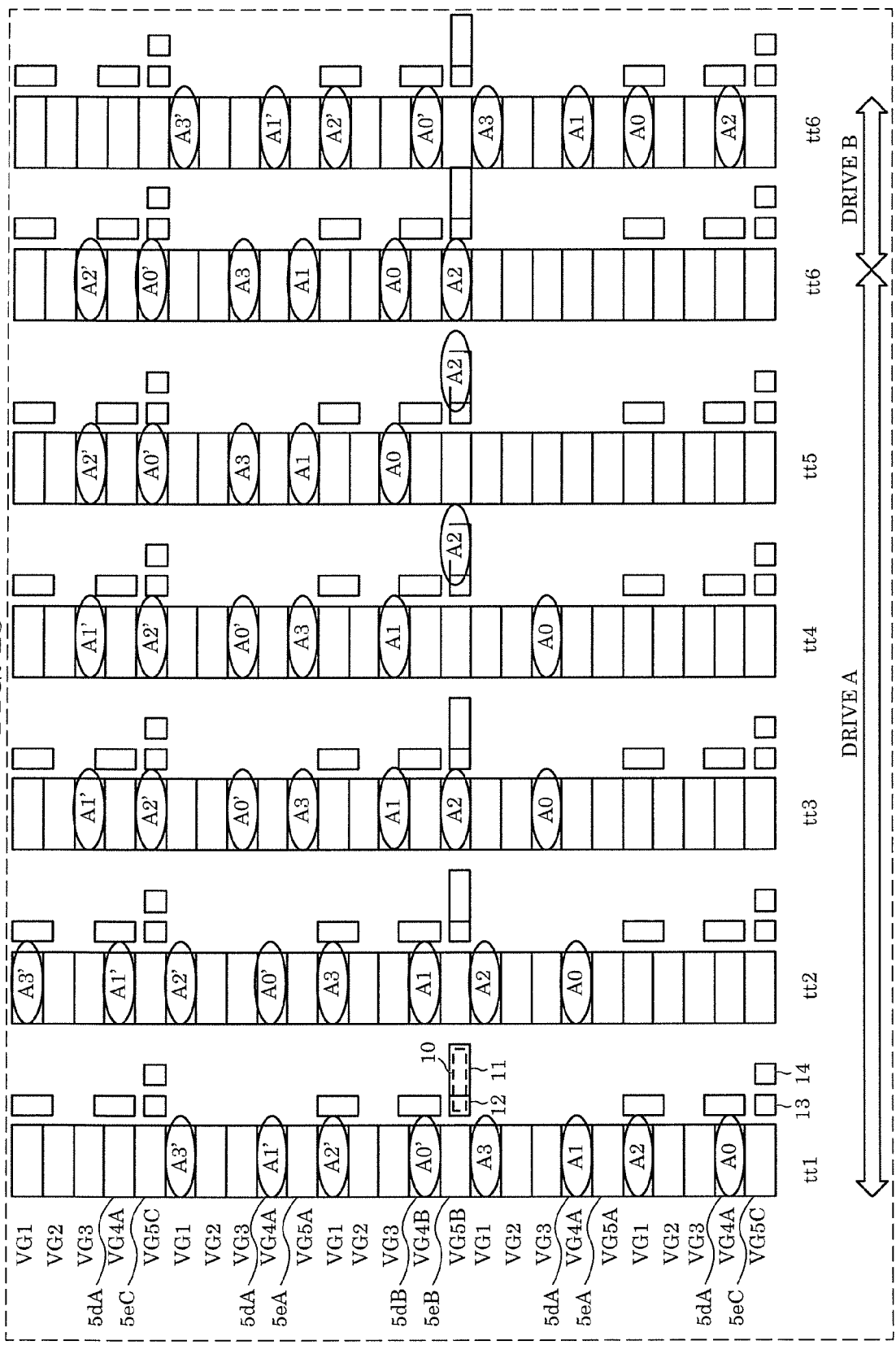
FIG. 23 is a schematic plan diagram illustrating interchange operation of signals A0 and A2 of the solid-state imaging device according to Embodiment 2 during exposure.

FIG. 23 is a schematic plan diagram illustrating interchange operation of signals A0 and A2 in the solid-state imaging device according to Embodiment 2 during exposure.

The operation illustrated in FIGS. 22A, 22B, and 23 corresponds to the interchange operation of signals A0 and A2 in interchange operation (1) in FIG. 20. Drive A is operation from the initial state to when signals A0 and A2 are interchanged, and drive B is operation from when the interchange ends to when each signal returns to the initial exposure position. Drive B is typical 5-phase drive.

In FIGS. 22A, 22B, and 23, drive pulses VG1, VG2, VG3, VG4A, VG4B, VG5A, VG5B, and VG5C are applied to respective transfer electrodes 5, to transfer a signal charge to a desired location. While the operation is based on 5-phase drive, the solid-state imaging device according to Embodiment 2 includes two types of transfer electrodes 5d to which VG4A and VG4B are applied (transfer electrodes 5dA and 5dB in this example) and two types of transfer electrodes 5e to which VG5A and VG5B are applied (transfer electrodes 5eA and 5eB in this example) for control of drive in interchange operation, as in the solid-state imaging device according to Embodiment 1. In addition, the solid-state imaging device according to Embodiment 2 includes transfer electrode 5e to which VG5C is applied (transfer electrode 5eC in this example), to make transfer electrodes 5 adjacent to output control gate 13 independent.

VG5C is applied at different timing from VG5A and VG5B, only in the case of transferring a signal charge to output control gate 13. In interchange operation and vertical transfer using normal 5-phase drive, VG5C is applied at the same timing as VG5A.

As illustrated in FIG. 23, in this case of operation, signal A2 is transferred to charge holder 10 and held once, and, after signal A0 is transferred to an upper part of charge holder 10, signal A2 is returned to under transfer electrode 5 to which VG5B is applied, thus achieving interchange operation of signals A0 and A2 (drive A). After this, transfer to the pixel subjected to exposure is performed by normal 5-phase drive (drive B). The correspondence between the signal arrangement in FIG. 23 and the timing charts in FIGS. 22A and 22B in the time axis is indicated by tt1 to tt7.

Interchange operation of other signals can be equally performed by vertical transfer and input/output of a signal charge to/from charge holder 10.

In this embodiment, since respective signals are accumulated in different charge accumulators 2 during a signal read period, dark current differences and parasitic sensitivity differences occur in this period, too. Therefore, interchange operation of signal charges between charge accumulators 2 needs to be performed in the signal read period, too.

Figure 24:
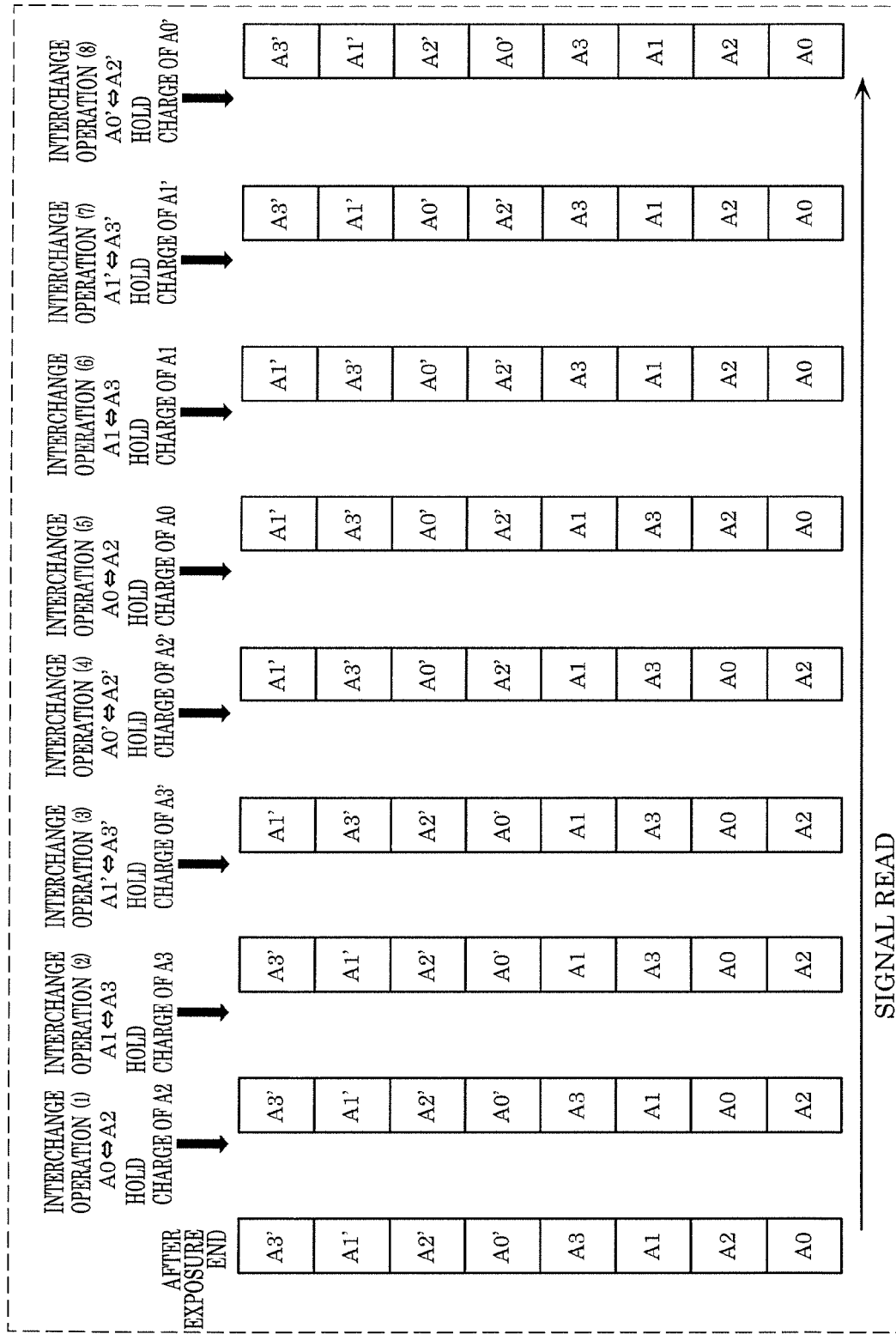
FIG. 24 is a plan diagram illustrating arrangement of each signal and operation of the solid-state imaging device according to Embodiment 2 during signal read.
Figure 25A:
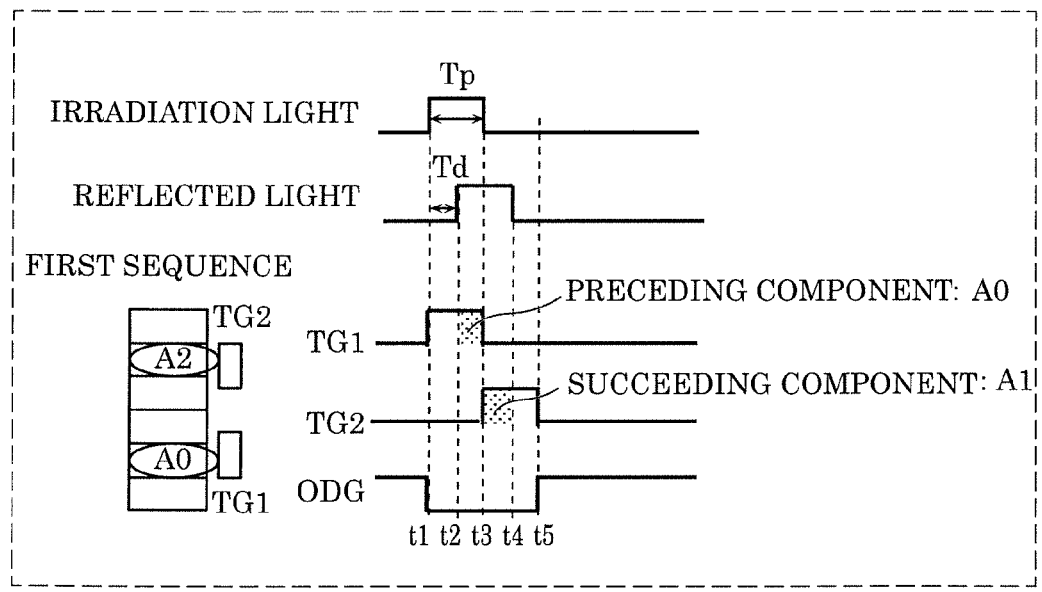
FIG. 25A is a drive timing chart illustrating operation of a solid-state imaging device according to Embodiment 3 during exposure.
Figure 25B:
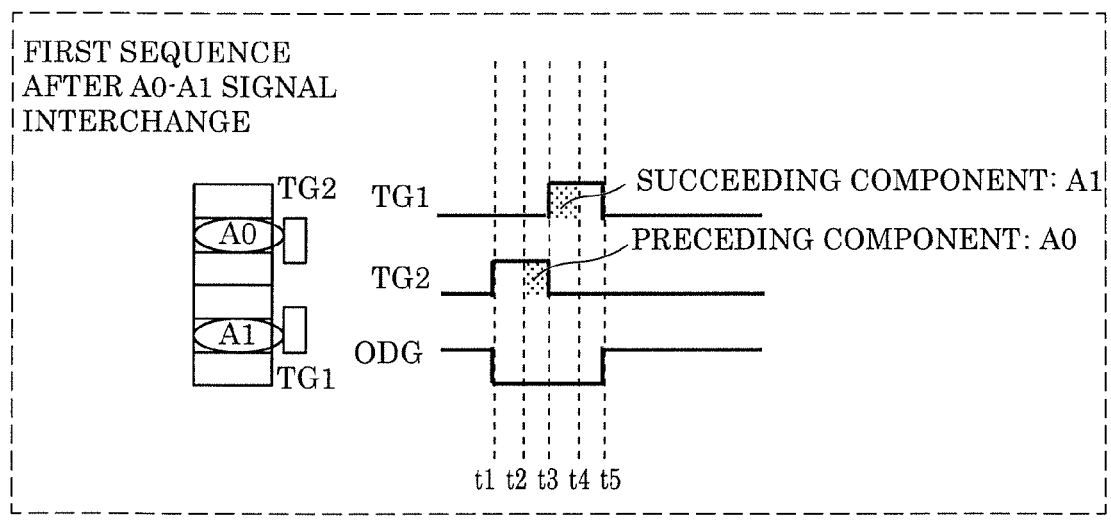
FIG. 25B is a drive timing chart illustrating operation of the solid-state imaging device according to Embodiment 3 during exposure.
Figure 25C:
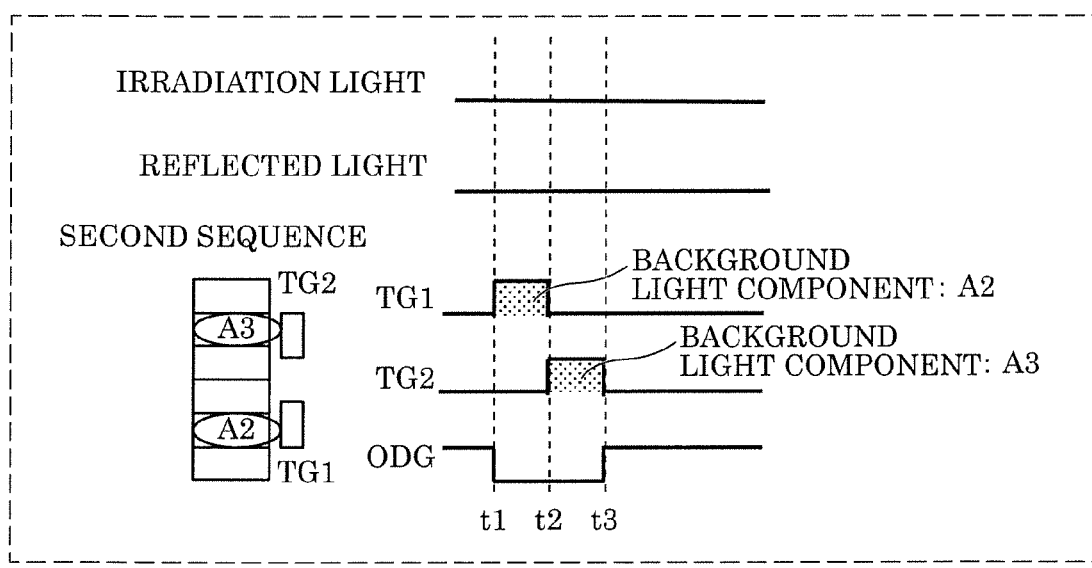
FIG. 25C is a drive timing chart illustrating operation of the solid-state imaging device according to Embodiment 3 during exposure.
Figure 25D:
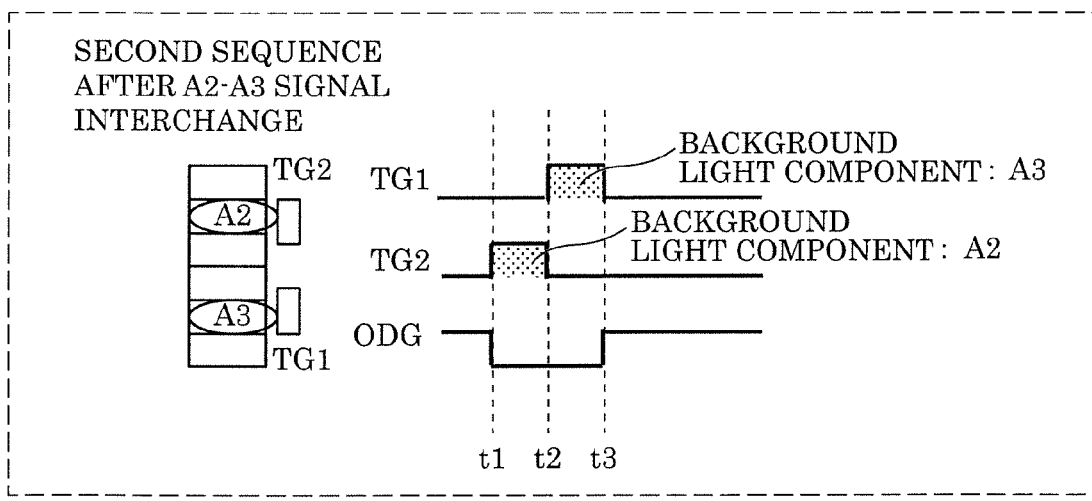
FIG. 25D is a drive timing chart illustrating operation of the solid-state imaging device according to Embodiment 3 during exposure.
Figure 26A:
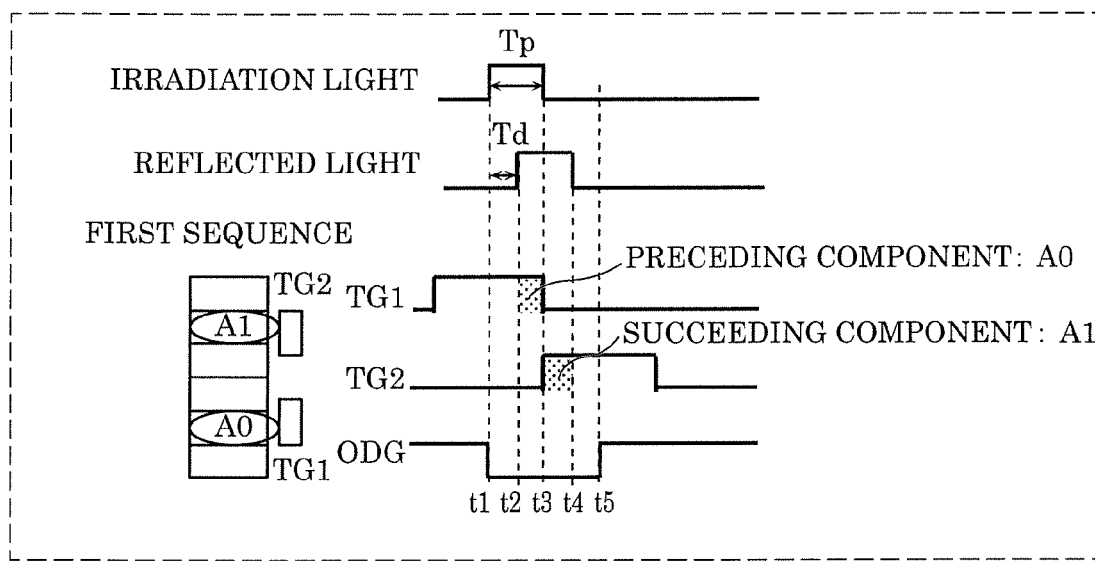
FIG. 26A is a drive timing chart illustrating operation of the solid-state imaging device according to Embodiment 3 during exposure.
Figure 26B:
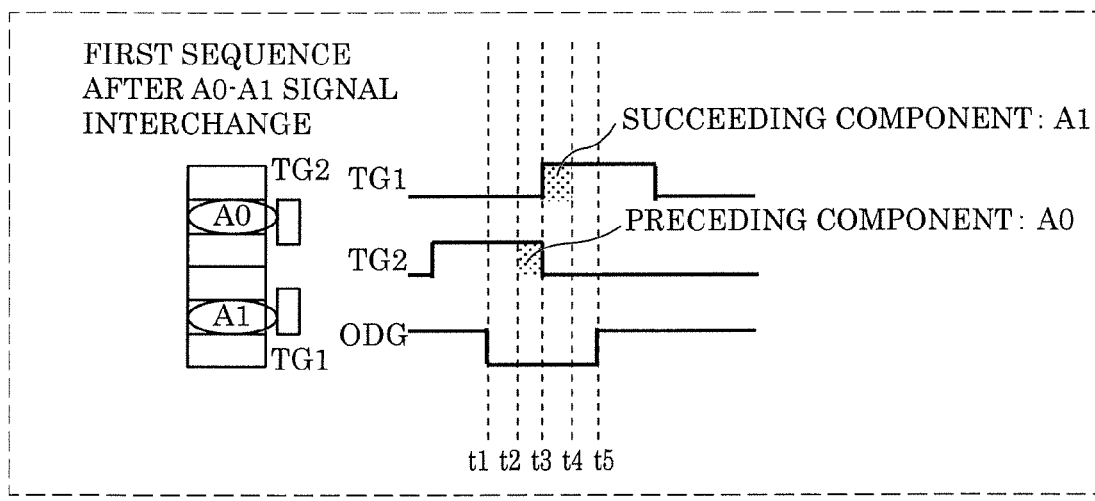
FIG. 26B is a drive timing chart illustrating operation of the solid-state imaging device according to Embodiment 3 during exposure.
Figure 26C:
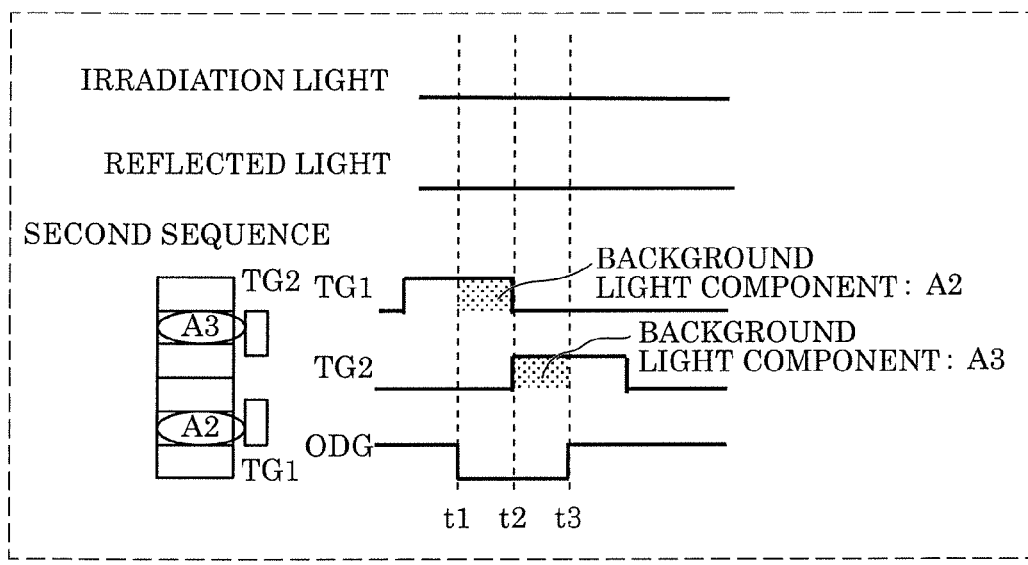
FIG. 26C is a drive timing chart illustrating operation of the solid-state imaging device according to Embodiment 3 during exposure.
Figure 26D:
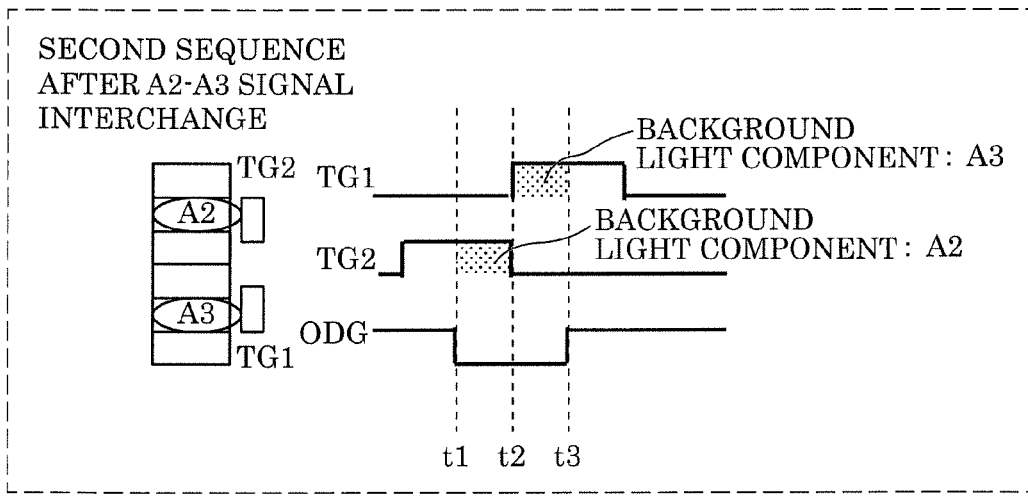
FIG. 26D is a drive timing chart illustrating operation of the solid-state imaging device according to Embodiment 3 during exposure.

FIG. 24 is a plan diagram illustrating arrangement of each signal and operation of the solid-state imaging device according to Embodiment 2 during signal read. Transfer electrodes 5 are omitted, and only first charge accumulator 2a, second charge accumulator 2b, third charge accumulator 2c, fourth charge accumulator 2d, and signals accumulated in respective charge accumulator 2 are illustrated, as in FIGS. 20 and 21. Interchange operation is performed eight times, i.e. (1) to (8). A signal held in charge holder 10 has dark current and parasitic sensitivity of charge holder 10 mixed therein. However, since eight signals A0 to A3 and A0' to A3' are each held once in charge holder 10, i.e. a total of eight times, to perform interchange operation, the dark current and parasitic sensitivity of charge holder 10 are divided into eight parts and evenly mix in the signals. By performing interchange operations (1) to (8) in the signal read period, too, dark current differences and parasitic sensitivity differences which occur in different charge accumulators 2 during this period can also be made equal between A0 and A2, between A1 and A3, between A0' and A2', and between A1' and A3'.

Although not illustrated in FIG. 19, charge holder reset gate 18 and charge holder reset drain 19 may be provided adjacent to charge holder 10, as in Basic Mode 3. By increasing the number of sharing pixels 20 in the column direction of the plurality of pixels 20 arranged in a matrix, i.e. the vertical direction in FIG. 19, the arrangement region of charge holder 10 has more room than in Embodiment 1. This eases arrangement of charge holder reset gate 18 and charge holder reset drain 19.

As described in detail above, according to this embodiment, the influence of parasitic sensitivity and dark current of charge holder 10 can be reduced and the amount of charge handled by charge holder 10 can be increased, as compared with Embodiment 1. A distance-measuring solid-state imaging device having excellent distance measuring accuracy can thus be provided.

Embodiment 3

A solid-state imaging device according to Embodiment 3 of the present disclosure will be described below with reference to drawings, mainly focusing on differences from the foregoing embodiments.

FIGS. 25A to 25D and 26A to 26D are each a drive timing chart illustrating operation of the solid-state imaging device according to Embodiment 3 during exposure. The TG pulse width is different between FIGS. 25A to 25D and FIGS. 26A to 26D (that is, the pulse width of TG pulse is greater than pulse width Tp of irradiation light), but the obtained signals are the same.

The layout structure of a pixel included in the solid-state imaging device according to Embodiment 3 may be any of those in Embodiments 1 and 2, and accordingly its description is omitted. The basic concept of signal interchange operation is the same as those in Embodiments 1 and 2, and accordingly its description is omitted.

This embodiment differs from Embodiments 1 and 2 in the operation timing during exposure, while using the same pixel layout structure. Specifically, while four signals A0, A1, A2, and A3 are used as in Embodiments 1 and 2, the number of light emissions of the light source is 1/2, and only A0 and A1 obtain signals including distance information from photoelectric converter 1 whereas A2 and A3 obtains background light components.

Operation of the solid-state imaging device according to Embodiment 3 will be described below.

As illustrated in FIGS. 25A to 25D and 26A to 26D, in a first sequence (see FIGS. 25A and 26A), signals A0 and A1 including distance information are obtained by application pulses TG1 and TG2. In a second sequence (see FIGS. 25C and 26C), signals A2 and A3 which are background light components not including distance information are obtained. Regarding the exposure timing after signal interchange, in the first sequence, the first sequence after A0–A1 signal interchange (see FIGS. 25B and 26B) is used. In the second sequence, the second sequence after A2–A3 signal interchange (see FIGS. 25D and 26D) is used. Thus, differences in read characteristics and dark current differences and parasitic sensitivity differences of charge accumulators 2 can be canceled out as in Embodiments 1 and 2, and also background light components can be subtracted.

The distance measuring range is 1/3 of that in Embodiments 1 and 2, but the number of light emissions can be reduced to 1/2 as compared with the exposure timing illustrated in FIGS. 11A and 11B. This is useful exposure timing for applications for which near field and low power consumption are required. Such feature that can support a plurality of applications by changing exposure timing with the same pixel layout structure is very useful for distance-measuring imaging apparatuses with various required specifications.

As described in detail above, according to this embodiment, the number of light emissions can be reduced to 1/2 as compared with Embodiments 1 and 2, so that a distance-measuring solid-state imaging device suitable for applications for which near field and low power consumption are required can be provided.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to solid-state imaging devices and imaging apparatuses for obtaining distance images of subjects.

What is claimed is:

1. A solid-state imaging device, comprising:
a pixel on a semiconductor substrate,
wherein the pixel includes:
a photoelectric converter that converts received light into a signal charge;
at least one read gate that reads the signal charge from the photoelectric converter;
a plurality of charge accumulators that each accumulate the signal charge read by the at least one read gate; and
a charge holder that is arranged apart from a transfer channel in a direction orthogonal to a direction in which the transfer channel extends, ant that receives and holds the signal charge from one of the plurality of charge accumulators, and transfers the signal charge to one of the plurality of charge accumulators,
each of the plurality of charge accumulators includes a part of the transfer channel for transferring the signal charge and a part of a transfer electrode overlapping with the part of the transfer channel in a planar view of the semiconductor substrate,
the transfer channel per one pixel comprises a plurality of transfer channels,
the solid-state imaging device further comprises a timing generator that performs interchange of a location in which a first signal charge is accumulated and a location in which a second signal charge is accumulated in a case where the at least one read gate reads the first signal charge and the second signal charge, and
the timing generator performs the interchange a plurality of times, to cause a total number of times the first signal charge is transferred to the charge holder and a total number of times the second signal charge is transferred to the charge holder to be equal.

2. The solid-state imaging device according to claim 1, comprising:
a plurality of pixels arranged in a matrix, the plurality of pixels each being the pixel,
wherein in the plurality of pixels, the signal charge is read from the photoelectric converter in opposite directions in a row direction in arrangement of the plurality of pixels, on a row-by-row basis.

3. The solid-state imaging device according to claim 1, wherein the at least one read gate comprises a plurality of read gates that include a first read gate and a second read gate, and
the first read gate and the second read gate respectively read the first signal charge and the second signal charge, with a first phase difference.

4. The solid-state imaging device according to claim 3, wherein the plurality of charge accumulators include a first charge accumulator and a second charge accumulator, and
the timing generator performs the interchange, after the first read gate reads the first signal charge to the first charge accumulator and the second read gate reads the second signal charge to the second charge accumulator with the first phase difference.

5. The solid-state imaging device according to claim 4, wherein the first read gate reads the signal charge to the second charge accumulator and the second read gate reads the signal charge to the first charge accumulator, with a second phase difference that differs by 180 degrees in phase from the first phase difference.

6. The solid-state imaging device according to claim 1, wherein the timing generator performs the interchange in a signal read period.

7. The solid-state imaging device according to claim 1, wherein the charge holder includes a charge holding channel and a charge holding gate, and
a negative voltage is applied to the charge holding gate to cause pinning of an interface between the charge holding channel and the charge holding gate in at least a part of a period except a period in which the charge holder holds the signal charge.

8. The solid-state imaging device according to claim 1, wherein at least a part of the charge holder is covered with a light shielding film.

9. The solid-state imaging device according to claim 1, wherein the pixel further includes:
a charge holder reset drain that discharges at least a part of the signal charge from the charge holder; and
a charge holder reset gate that controls the discharge to the charge holder reset drain.

10. The solid-state imaging device according to claim 1, wherein the pixel further includes:
an overflow drain that discharges at least a part of the signal charge from the photoelectric converter; and
an exposure control gate that controls the discharge to the overflow drain.

11. The solid-state imaging device according to claim 1, wherein the transfer electrode has a rectangular shape.

12. The solid-state imaging device according to claim 1, comprising:
a channel stop region that separates the plurality of transfer channels,
wherein a length of the transfer electrode on the channel stop region is shorter than a length of the transfer electrode on the transfer channel.

13. The solid-state imaging device according to claim 1, wherein a pulse width of a drive pulse for driving the at least one read gate is greater than a pulse width Tp of irradiation light.

14. A solid-state imaging device, comprising:
a plurality of pixels arranged in a matrix,
wherein each of the plurality of pixels includes:
a photoelectric converter that converts received light into a signal charge;
at least one read gate that reads the signal charge from the photoelectric converter; and
a plurality of charge accumulators that each accumulate the signal charge read by the at least one read gate,
each of the plurality of charge accumulators includes a plurality of transfer channels per one pixel, and a transfer electrode,
the plurality of pixels include a plurality of first pixels and a plurality of second pixels,
each of the plurality of first pixels further includes a charge holder that is arranged apart from a corresponding transfer channel in a direction orthogonal to a direction in which the corresponding transfer channel extends, and that receives and holds the signal charge from one of the plurality of charge accumulators, and transfers the signal charge to one of the plurality of charge accumulators,
each of the plurality of second pixels further includes a floating diffusion layer that receives, from one of the plurality of charge accumulators, transfer of the signal charge accumulated in the one of the plurality of charge accumulators and holds the signal charge, the solid-state imaging device further comprises a timing generator that performs interchange of a location in which a first signal charge is accumulated and a location in which a second signal charge is accumulated in a case where the at least one read gate reads the first signal charge and the second signal charge, and the timing generator performs the interchange a plurality of times, to cause a total number of times the first signal charge is transferred to the charge holder and a total number of times the second signal charge is transferred to the charge holder to be equal.

15. The solid-state imaging device according to claim 14, wherein each of the plurality of first pixels shares the floating diffusion layer with at least one of the plurality of second pixels arranged with a corresponding first pixel in a column direction.

16. The solid-state imaging device according to claim 14, wherein each of the plurality of second pixels shares the charge holder with at least one of the plurality of first pixels arranged with a corresponding second pixel in a column direction.

17. An imaging apparatus, comprising:

the solid-state imaging device according to claim 1;

a light source that emits infrared light in a pulse form at a plurality of timings; and a processor that generates a distance image based on an output signal of the solid-state imaging device.

\* \* \* \* \*